United States Patent [19]

Yaniv et al.

[11] Patent Number: 4,666,252

[45] Date of Patent: May 19, 1987

[54] HIGH YIELD LIQUID CRYSTAL DISPLAY AND METHOD OF MAKING SAME

[75] Inventors: Zvi Yaniv, Southfield; Vincent D. Cannella, Birmingham; Gregory L. Hansell, Ann Arbor; Robert R. Johnson, Franklin, all of Mich.

[73] Assignee: Energy Conversion Devices, Inc., Troy, Mich.

[21] Appl. No.: 626,214

[22] Filed: Jun. 29, 1984

[51] Int. Cl.⁴ ............................................. G02F 1/13
[52] U.S. Cl. ................................ 350/333; 350/339 R
[58] Field of Search ........................... 350/333, 339 R

[56] References Cited

U.S. PATENT DOCUMENTS

| | | | |
|---|---|---|---|
| 3,654,606 | 4/1972 | Marlowe et al. | 340/166 |
| 4,413,883 | 11/1983 | Baraff et al. | 350/333 X |
| 4,422,161 | 12/1983 | Kressel et al. | 365/200 |
| 4,470,060 | 9/1984 | Yamazaki | 350/333 X |
| 4,523,811 | 6/1985 | Ota | 350/339 R X |
| 4,572,615 | 2/1986 | Nickol et al. | 350/339 R X |

Primary Examiner—John K. Corbin
Assistant Examiner—Richard F. Gallivan
Attorney, Agent, or Firm—Richard O. Gray; Marvin S. Siskind; Lawrence G. Norris

[57] ABSTRACT

A quick testable subassembly with redundant isolation devices usable in a liquid crystal display has a pair of coplanar spaced apart electrode segments connected to one or more isolation devices. Address lines are connected to the isolation devices or the electrodes. The isolation devices and electrical connections to the electrode segments can be quickly tested prior to assembly of a complete display. Redundant isolation devices are formed on the subassembly and inoperative isolation devices can be replaced by associated redundant isolation devices. A method of quickly testing the subassembly and of replacing inoperative isolation devices, and several alternate quickly testable subassembly geometries are also disclosed. A self-selecting redundant geometry and method are also disclosed.

279 Claims, 24 Drawing Figures

HIGH YIELD LIQUID CRYSTAL DISPLAY AND METHOD OF MAKING SAME

FIELD OF THE INVENTION

The present invention relates generally to liquid crystal displays and to methods of increasing the manufacturing yield of such displays.

BACKGROUND OF THE INVENTION

Liquid crystal displays may be used advantageously in many applications. For example, liquid crystal displays are extensively used in calculators, digital watches, digital clocks, and very small television displays.

Conventional liquid crystal displays include a plurality of pixels arranged in rows and columns. Each pixel usually includes two electrodes formed on spaced apart substrates with the liquid crystal material located between the electrodes. Depending upon the optical properties of the material, either a transmissive or a reflective display can be formed.

To control a display, selected electrical potentials are applied across the electrodes. The electrodes in turn impress a field onto the liquid crystal material causing it to take a desired orientation, thereby forming the transmissive or reflective display. In order to form a complex display a substantial number of pixels is necessary. Each pixel must be addressable, usually by means of x and y address lines. Further, experience has shown that it is very desirable when using nematic liquid crystal display material to alternate the polarity of the potentials applied to the electrodes for the purpose of extending the life of the display material. To increase the isolation between pixels, isolation devices such as diodes or transistors are often used in connection with each electrode. In view of the large number of isolation devices needed, at least one per electrode, it is desirable to form them on the substrate adjacent the respective display electrode. Exemplary displays of this type are disclosed in U.S. patent application Ser. No. 573,004, entitled "Liquid Crystal Displays Operated by Amorphous Silicon Alloy Diodes," filed Jan. 23, 1984 and assigned to the Assignee of the present invention.

If a display has, for example, 1,000 pixels, at least 1,000 operative isolation devices must be formed on the substrate. It is well known that in the manufacture of integrated or thin film semiconductor devices that a certain percentage of the devices which are formed will be defective for various reasons. Because of the failure rate in forming isolation devices, pixels in a display can be unusable due to inoperative isolation devices. Thus, the ability to test a display quickly to determine if it is usable is important.

SUMMARY

The present invention provides for a subassembly for use in making a display of a type that incorporates a light influencing material. One such material is nematic liquid crystal display material. The subassembly has a substrate on which are formed one or more coplanar, spaced apart electrodes. The subassembly also includes one or more isolation devices coupled to respective electrodes. Addressing means are provided for enabling the selective application of electrical potentials to each isolation device to enable the selective testing thereof. The subassembly can also include redundant isolation devices which can be used to replace defective isolation devices and to enable the selective application of driving potentials across the pairs of electrodes for operating the display.

The invention also provides for a switching element coupled in series with each redundant isolation device. By applying radiant energy thereto the switching device will change from a relatively low conductivity state to a relatively high conductivity state coupling the redundant isolation device to the respective electrode. The switching element, or antifuse, can be formed of an energy sensitive chalcogenide or a fusable amorphous semiconductor alloy.

The invention also provides for a display of a type that includes a light influencing material. The display includes a plurality of pixels with each pixel having a pair of spaced apart electrodes with light influencing material positioned there between. One type of material that can be used is a conventional nematic liquid crystal display material. One or more isolation devices is coupled to respective pixel electrodes. Addressing means are provided for enabling the selective application of electrical potentials to each isolation device to enable the selective testing thereof.

A subassembly is provided that incorporates self-selecting redundancy. A redundant isolation structure is formed with parallel branches including at least one isolation element, such as a diode, in each branch. One form of self-selecting redundancy includes at least two series connected diodes in each branch. A second form includes a diode in series with a thin-film fuse in each branch. The thin film fuse is vaporized by a current that flows there through in the event the series connected diode is short circuited.

The invention also provides for a method of making and testing a subassembly for a display including the steps of providing a substrate, forming a plurality of spaced apart electrodes on the substrate, forming one or more isolation devices each coupled to a respective electrode, and applying electrical potentials to each isolation device individually to test the operation thereof. The method can further include the steps of forming one or more redundant isolation devices, uncoupling each inoperative isolation device and coupling selected redundant isolation devices to respective electrodes as replacements.

The method can further include using electrical or radiant energy to uncouple inoperative isolation devices and using electrical or radiant energy to electrically couple replacement isolation devices to respective pixel electrodes. The method can further include forming diodes or transistors as isolation devices and redundant isolation devices. The method can further include forming a subassembly for a display by providing a substrate, forming a first electrode on the substrate, forming an isolation device electrically coupled to the pixel electrode, forming a first address line electrically coupled to the isolation device and a second address line coupled to the electrode than applying selected electric potentials between the first and second address lines to test the electrical connectivity therebetween and the operation of the isolation device.

The method also provides for forming a subassembly for a display with self-selecting redundancy. The method includes forming an electrode, as well as forming isolation means and redundant isolation means including means for selecting the redundant isolation means in the event of a failure of the isolation means.

DETAILED DESCRIPTION OF THE PREFERRED EMBODIMENTS

With reference to the figures, FIGS. 1 through 6 illustrate an embodiment of the present invention. FIGS. 7 and 8 illustrate several additional alternate embodiments of the invention. FIGS. 9 through 13 illustrate yet another embodiment of the invention.

Figure 1:
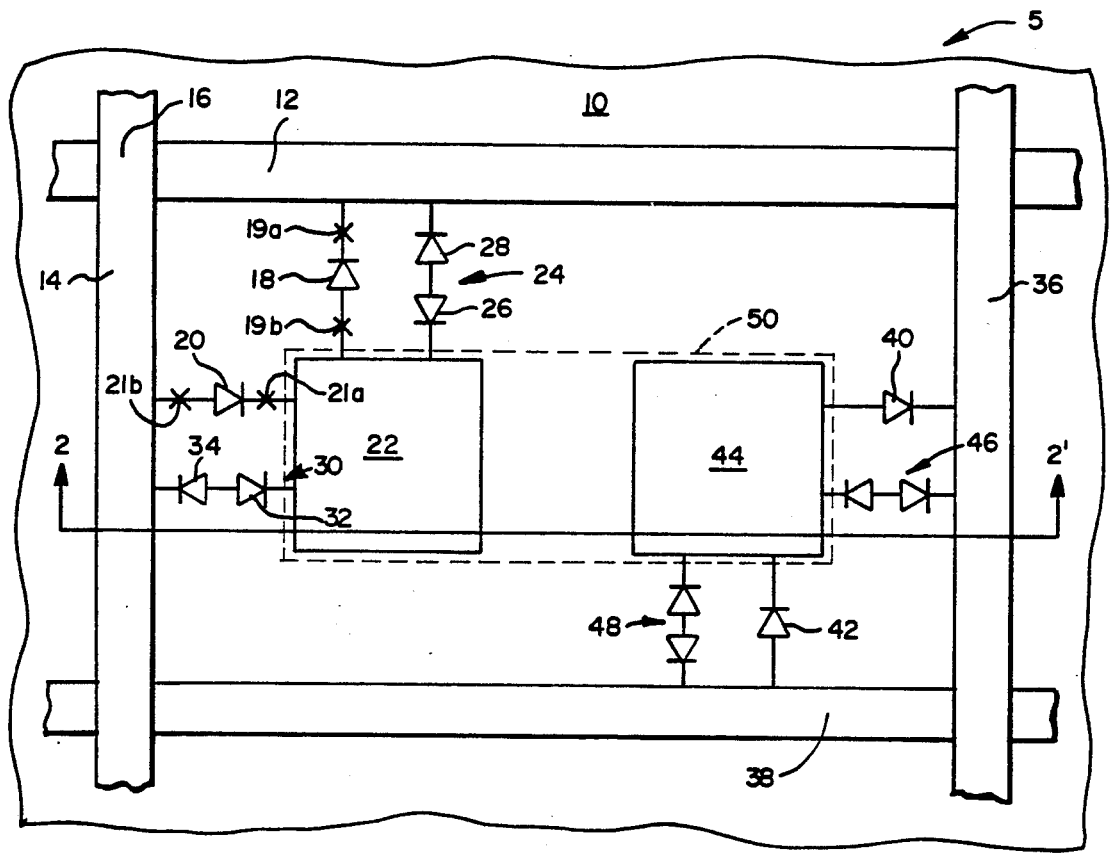
FIG. 1 is a partially diagrammatic, partially schematic view of an embodiment of the invention.
Figure 2:
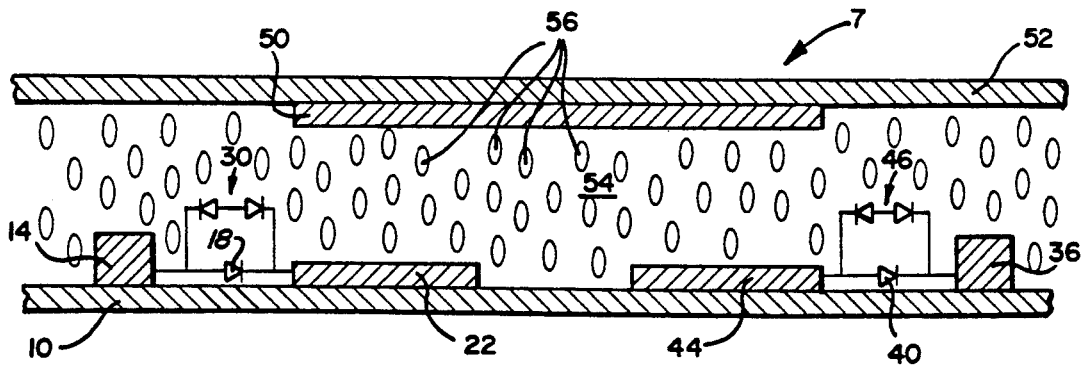
FIG. 2 is a section taken along line 2—2' of FIG. 1.

FIG. 1 is a partly diagrammatic, partly schematic view of a subassembly 5 of a display embodying the present invention. In a preferred exemplary embodiment, a liquid crystal display is disclosed. The invention is applicable to any display incorporating a light influencing material as defined below. FIG. 2 is a view in section taken along line 2—2' of FIG. 1 of the subassembly 5 incorporated into a pixel 7 of a liquid crystal display. Although just the subassembly 5 for one pixel 7 is illustrated, it can be appreciated that many such subassemblies can be formed in, for example, a row and column matrix to provide a two-dimensional display. The subassembly 5 is formed on an transparent insulating substrate 10, such as glass. Formed on the substrate 10 are a pair of address lines 12, 14 which cross one another at an insulated cross-over 16. Connected to address line 12 is an isolation diode 18 and connected to address line 14 is an isolation diode 20. The diodes 18 and 20 are each connected to an electrode segment 22 which is illustrated in a substantially rectangular shape. The isolation diodes 18 and 20 in combination with the address lines 12 and 14 can be used to address the electrode segment 22 when the subassembly 5 is being tested or under normal operating conditions.

As can be seen from FIG. 1 the address lines 12, 14, the diodes 18, 20 and the electrode segment 22 are connected electrically in series. Because of the series connection it is possible to apply voltages to the address lines 12 and 14 during the manufacturing process to test the operation of the diodes 18 and 20. Additionally, in view of the fact that the electrode segment 22 is in series with the diodes 18 and 20 this testing also tests the electrical continuity between the address lines 12 and 14 and the electrode segment 22 when the diodes 18 and 20 are forward biased.

Formed on the substrate 10 is redundant isolation structure 24 which includes series connected diodes 26, 28. The diodes 26, 28 are connected in parallel with the diode 18 between the address line 12 and the pixel electrode 22. A second redundant isolation structure 30 formed of series connected diodes 32, 34 is connected between the address line 14 and the pixel electrode 22 in parallel with the diode 20. The isolation structures 24, 30 are formed as far away from the respective diodes 18, 20 as possible to minimize the possibility of a dual failure due to a common mechanical cause such as a grain of dust on the substrate 10.

If, after testing the diodes 18 and 20 it is determined that one or the other is defective, the redundant isolation device structures 24 and 30 can be used to replace the diodes 18 and 20. The diodes 26 and 34 are switching elements that can be removed from the circuit if it is necessary to use the redundant isolation diodes 28 and 32. Diodes 18 and 20 can be disconnected from the electrode 22 by directing radiant energy, such as from a laser or other high intensity light source at connection points such as 19a or 19b associated with diode 18 as well as connection points 21a or 21b associated with the diode 20. The high intensity radiant energy directed at the points 19 and 21 will vaporize previously deposited metal contacts thereby isolating the diode 18 and the diode 20 from the pixel electrode 22. Additionally, breakdown voltages can be applied across the address lines 12 and 14 to cause diode 26 and diode 34 to break down and short circuit. After the breakdown potentials are applied the diodes 28 and 32 can then be used as alternate isolation devices when addressing the electrode 22. Diodes 26 and 34 are switches or isolation devices which keep diodes 28 and 32 respectively disconnected from the electrode 22 until diodes 26 and 34 are shorted. If the potential to the address lines 12 and 14 is reversed, the resultant addressing isolation devices become 26 and 34 instead of 28 and 32.

Optical energy, from a laser, can also be used to heat and fuse or short circuit the switching diodes 26, 34 instead of using potentials applied to the address lines 12, 14 to short circuit those diodes. It will be understood that in this context, the phrase "short circuit" refers to a switching element such as the diode 26 assuming a high conductivity, low resistance state so as to permit a corresponding isolation diode 28 to be used to address element 22. The phrase "short circuit" can also include a direct metal-to-metal connection.

Also formed on the substrate 10 is a second pair of address lines 36, 38 which is connected by isolation diodes 40, 42 to a second electrode segment 44 also formed on the substrate 10. The electrode segment 44 is coplanar with and laterally spaced apart from the electrode segment 22. Redundant isolation structures 46 and 48 are connected respectively between the address line 36 and the electrode segment 44 and between the address line 38 and the electrode segment 44. The redundant isolation structures 46 and 48 are used in precisely the same way as are the previously discussed redundant isolation structures 24, 30.

A third electrode segment or common electrode 50, indicated by dashed lines, is formed on a second substrate 52 (not shown in FIG. 1) spaced apart from the first substrate 10. Between the substrates 10 and 52 is a region 54 which can be filled with a light influencing material 56. The material 56 can, for example, be a standard nematic liquid crystal material. By the term "light influencing material" is meant any material which emits light or can be used to selectively vary the intensity, phase, or polarization of light either being reflected from or transmitted through the material. Liquid crystal material is only one such material having these characteristics.

FIG. 2 illustrates the physical relationships between the substrates 10, 52 and the electrode segments 22, 44 and 50 of the pixel 7. In FIG. 2, the redundant diode structures 30, 46 are shown schematically connected in parallel with the isolation diodes 18, 40. The electrode segment 50 is shown formed on the substrate 52 with the region 54 between the electrodes 22, 44 and 50 filled with the liquid crystal material 56.

The pixel structure illustrated in FIGS. 1 and 2 is particularly applicable for practicing the present invention because all of the address lines, driven electrodes, and isolation devices are formed on a single substrate. Such pixel structures are particularly disclosed and claimed in, copending U.S. patent application Ser. No. 626,133, filed concurrently herewith, now U.S. Pat. No. 4,589,733 for Liquid Crystal Displays and Subassemblies Having Improved Pixel Electrodes, which application is incorporated by reference herein.

The diodes illustrated in FIGS. 1 and 2 such as the isolation diode 18 or the redundant diodes 26, 28 are preferably formed from a deposited semiconductor material. The deposited semiconductor material is preferably an amorphous semiconductor alloy including silicon. The amorphous silicon alloy can also include hydrogen and/or fluorine and can be deposited by plasma assisted chemical vapor deposition i.e. glow discharge as disclosed for example in U.S. Pat. No. 4,226,898 which issued on Oct. 7, 1980 in the names of Stanford R. Ovshinsky and Arun Madan for "Amorphous Semiconductors Equivalent to Crystalline Semiconductors Produced by a Glow Discharge Process."

Alternately, the redundant isolation structures 30, 46 can be formed as back-to-back Schottky barrier diodes sharing a common layer of amorphous silicon alloys positioned between two thin films of a high work function metal such as platinum, palladium, chromium, iridium or rhodium. Such diodes are disclosed in the '898 patent. As yet another alternative, the redundant diode structures 30, 46 can be formed of back-to-back semiconductor diodes with a common intrinsic semiconductor layer between two similarly doped semiconductor layers such as are disclosed in pending U.S. patent application Ser. No. 603,852, filed Apr. 25, 1984, entitled "Programmable Semiconductor Switch for a Display Matrix or the Like and Method of Making Same," assigned to the Assignee of the present invention. The disclosure of the 747 application is hereby incorporated by reference.

One particular advantage of the pixel 7 is the ability to quickly test the subassembly 5 which is inherent in that structure. As discussed above, during the testing procedure the application of an electrical potential across the address lines 12, 14 makes it possible to test the operation and the electrical conductivity of the series combination formed of the address line 12, diode 18, electrode segment 22, diode 20 and address line 14. A similar test sequence can be run with respect to the electrode segment 44. Hence, if a subassembly 5 is first formed including all of the structure on the substrate 10 it is possible to thoroughly test that subassembly and replace defective isolation devices with the available redundant devices such as 26 or 32 before the substrate 52 is ever attached to the substrate 10. Because only the subassembly 5 is being tested, and the liquid crystal material is not present to slow down the test procedure, the test sequence can be performed at a much faster rate than a complete display can be tested. The ability to quickly test the structure of the substrate 10 and to replace non-functional isolation devices is especially important from a manufacturing point of view. One of the most difficult problems encountered in the manufacture of devices such as liquid crystal displays is the random failure of isolation elements. The structure of FIGS. 1 and 2 provides a solution to this problem.

Figure 3:
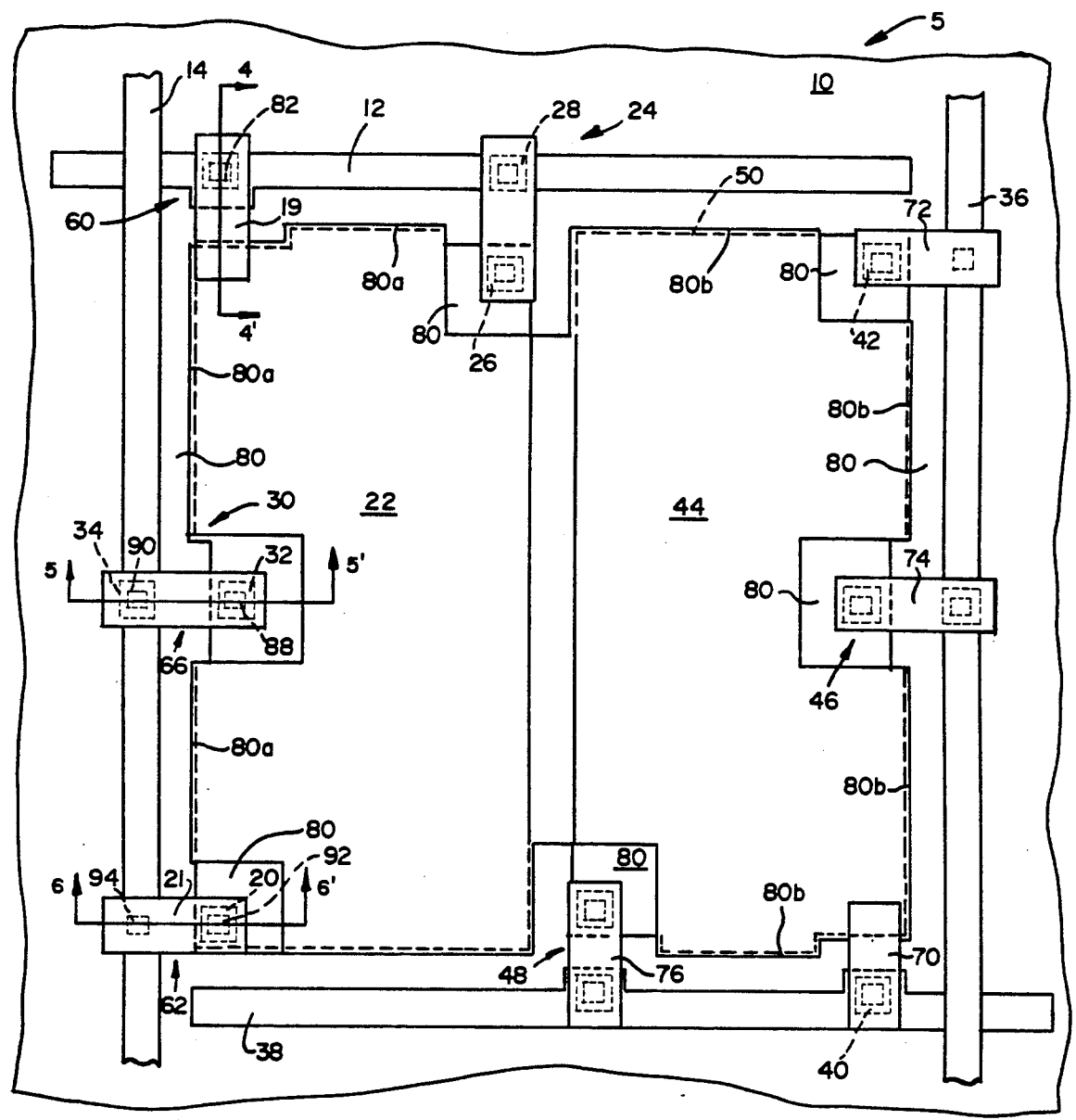
FIG. 3 is a top plan view of a subassembly of a liquid crystal display embodying the present invention.

FIG. 3 is a top plan view of the subassembly 5 showing in more detail an exemplary structure. The same identification numerals are used to identify elements in FIG. 3 as were used to previously identify corresponding elements in FIGS. 1 and 2. In FIG. 3, the isolation diode 18 (shown in dashed lines) is formed above a region of the address line 12 and beneath a section of a deposited conductor 60. The conductor 60 couples the diode 18 to the electrode segment 22. The conductor 60 can be deposited using standard deposition techniques and may be formed of a variety of metals such as aluminum, molybdenum, chromium, tantalum, tungsten, palladium and platinum. The conductor 60 could also be a conductive semiconductor material. The isolation diode 20 is formed on a region of the electrode segment 22 and is connected to the address line 14 by a deposited conductor 62. The conductor 62 is the same type of material as is the conductor 60.

The diode 18 can be disconnected at point 19a or 19b of FIG. 1 after the testing sequence if it is inoperative. The region 19a or 19b is shown in FIG. 3 as a generalized region 19 which is near the center of the conductor 60. The diode 20 can be disconnected from the address line 14 by removing a part of the conductor 62. If after testing the diode 20 in combination with the diode 18 it becomes necessary to disconnect them, the disconnection can be made at the regions 19, 21 corresponding to either the anode or the cathode of the diode 18 and the diode 20 by use of a directed laser beam to vaporize the deposited conductors 60, 62 in the regions 19, 21 or by applying current through the conductors 60, 62 to vaporize them.

Shown in FIG. 3 is the redundant structure 24 which is formed with diode 28 located on a region of the address line 12 and diode 26 located on a region of the pixel electrode 22. The diodes 26 and 28 are interconnected by a deposited conductive layer 64 corresponding to the type of metal or material used in forming the conductor 60.

Shown in FIG. 3 is the redundant structure 30 which is formed with diode 34 located on a region of the address line 14 and diode 32 located on a region of the pixel electrode 22. The diodes 32 and 34 are interconnected by a deposited conductive layer 66 corresponding to the type of metal or material used in forming the conductor 60.

As can be seen from FIG. 3 the isolation diodes 40, 42 and the redundant structures 46, 48 have the same position and structure with respect to the electrode segment 44 as do the diodes 18, 20 and the redundant structures 30 and 24 with respect to the electrode segment 22. Connective layers 70, 72, 74 and 76 correspond in function and structure with respect to the electrode segment 44 as do the connectors 60, 62, 64 and 66 discussed above.

An insulating layer 80, discussed subsequently, is formed on the substrate 10 and abuts the electrode segment 22 at a plurality of edges 80a. The insulating layer 80 overlies the electrode segment 22 adjacent the diodes 20, 26 and 32. Preferably, the layer 80 is transparent. The insulating layer 80 also abuts the electrode segment 44 at a plurality of edges 80b. In the region of the diode 42 and the redundant isolation structures 46, 48, the insulating layer 80 overlies the electrode segment 44. The edges of overlying electrode 50 correspond to the boundary edges 80a, 80b of the insulating layer 80.

The subassembly 5 of FIG. 3 can be tested without the spaced apart electrode segment 50 and second substrate 52 as discussed above.

Figure 4:
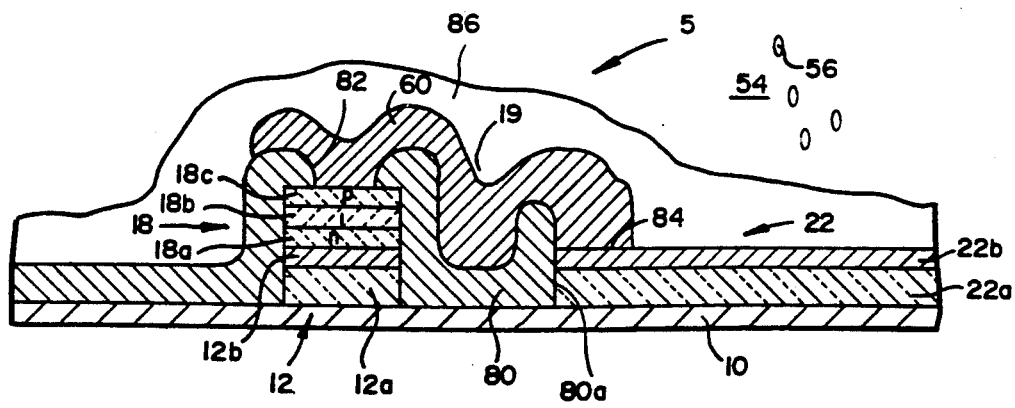
FIG. 4 is a sectional view taken along line 4—4' of FIG. 3.

FIG. 4 is a section taken along line 4—4' of FIG. 3 and shows the detailed structure of the subassembly 5 in the region of the isolation diode 18 and the conductive layer 60. The electrode segment 22 is formed on the substrate 10 as a deposited layer of indium tin oxide 22a and an overlying layer of chromium 22b. The two layer structure 22 is transparent permitting a viewer to look through the substrate 10, into the internal region 54 where the nematic liquid crystal fluid 56 is contained. The address line 12 is also formed of deposited layers 12a, 12b of indium tin oxide and chromium respectively.

The diode 18 is preferably formed from a deposited semiconductor material. The deposited semiconductor material is preferably an amorphous semiconductor alloy including silicon. The amorphous silicon alloy can also include hydrogen and/or fluorine and can be deposited by plasma assisted chemical vapor deposition i.e. glow discharge as disclosed, for example, in U.S. Pat. No. 4,226,898 which issued on Oct. 7, 1980 in the names of Stanford R. Ovshinsky and Arun Madan for "Amorphous Semiconductors Equivalent to Crystalline Semiconductors Produced by a Glow Discharge Process." The diode 18 preferably has an n-i-p configuration formed by an n-type doped region 18a, an intrinsic region 18b overlying the first doped region 18a, and a p-type doped region 18c overlying the intrinsic region 18b.

The diode 18 can be formed more specifically by depositing the previously mentioned amorphous silicon alloy over the region of the address line 12 and thereafter selectively etching portions of the amorphous silicon alloy by utilizing a suitable mask and conventional photolithography techniques. The mask utilized during the etching process preferably defines a diode configuration wherein each diode is about 20 to 50 microns on a side. One specific diode size is 30 microns by 30 microns. Representative thicknesses for the amorphous silicon alloy regions 18a, b, c can be, for example, 300 to 1,000 angstroms and preferably 500 angstroms for the p-type regions, 1,000 to 10,000 angstroms and preferably 3,000 angstroms for the intrinsic regions, and 300 to 1,000 angstroms and preferably 500 angstroms for the n-type regions.

Formed over the address line 12, the substrate 10, and the electrode segment 22 is the layer of insulating material 80. The insulating material 80 can be formed from any deposited insulator such as silicon oxide ($Si_xO_y$) or silicon nitride ($Si_xN_y$), or a polyimide, for example. The insulating layer 80 defines an opening or via 82 to the anode 18c of the diode 18. The configuration of the layer 80 can be obtained by roller, extrusion, or spin coating the polyimide, for example, over the entire surface area, spin coating a layer of photoresist over the polyimide layer, and then exposing and developing out both of the photoresist and the polyimide using a further mask. This step forms the opening 82 which exposes the anode 18c of the diode 18. The insulating layer 80 abuts the electrode segment 22 at the surface 80a as can be seen in FIG. 4 and also in FIG. 3.

The deposited conductive layer 60 is in contact with the anode 18c of the diode 18 and a region 84 of the electrode 22 and couples the diode 18 to electrode 22. The layer 60 can be deposited by means of a conventional sputtering process. A transparent passivating layer 86 formed, for example, from silicon dioxide covers the subassembly 5.

When it is desired to disconnect the diode 18 from the electrode 22 the conductive layer 60 can be heated either electrically or with optical energy, such as a laser beam, at the region 19. This localized heating at the region 19 results in a localized vaporization of the conductor 60.

Figure 5:
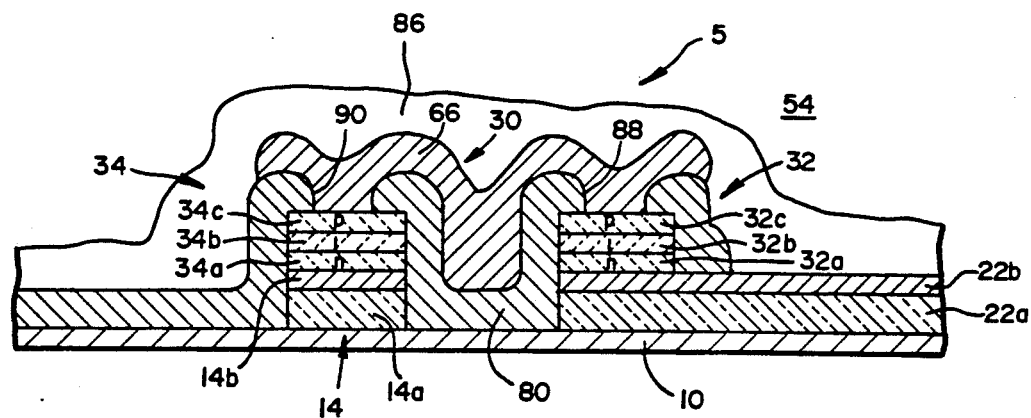
FIG. 5 is a sectional view taken along line 5—5' of FIG. 3.

FIG. 5 is a section taken along line 5—5' of FIG. 3 and discloses the structure of the redundant isolation device 30. The diode 32 is formed on a region of the electrode segment 22 as an n-i-p diode having layers 32a, 32b and 32c respectively out of deposited amorphous silicon alloy. The diode 34 is formed also as a n-i-p diode having layers 34a, b, c on a region of the address line 14. The insulating layer 80 supports the conductor 66 and insulates it from the subassembly 5 except at vias 88, 90. At the vias 88, 90 the conductive layer 66 is in contact with the anode 32c of the diode 32 and the anode 34c of the diode 34. Diodes 32, 34 are formed series coupled and in reverse relation so that normally no current will pass through the conductor 66.

Figure 6:
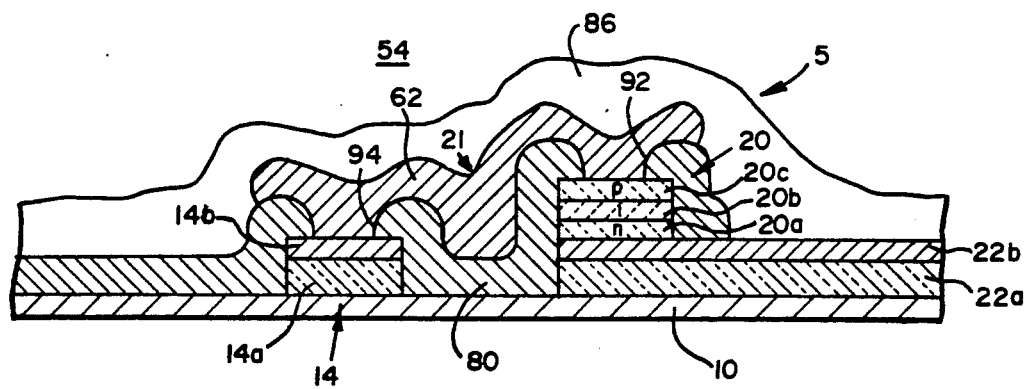
FIG. 6 is a sectional view taken along line 6—6' of FIG. 3.

FIG. 6 is a sectional view taken along line 6—6' of FIG. 3 and discloses the structure of the isolation diode 20 with respect to the electrode segment 22. The diode 20 is formed of three amorphous silicon layers 20a, 20b and 20c with an n-i-p structure on a region of the electrode 22. The address line 14 has two layers, a layer 14a of indium tin oxide which has been deposited on the substrate 10 and a layer 14b of chromium. The address line 14 is transparent. The insulating layer 80 which was previously deposited prior to depositing the conductor 62 insulates the conductor 62 from the subassembly 5 except where vias 92 and 94 permit the conductor 60 to contact the anode 20c of diode 20 and a region of the upper layer 14b of the address line 14.

When it is necessary to disconnect the diode 20 from the address line 14, energy, for example, in the form of a laser beam, can be directed at the region 21 or an electric current can be passed through the layer 62 to locally heat the region 21 causing local vaporization of the region 19 thereby isolating the diode 20.

The structure of the redundant diodes 26, 28 corresponds to that of the diodes 32, 34 of FIG. 5. The structure of the isolation diode 40 with respect to the electrode segment 44 corresponds to the previously discussed cross section of FIG. 4. The structures of the redundant isolation devices 46, 48 correspond to the previously discussed structure of FIG. 5. The structure of the diode 42 with respect to the electrode segment 44 corresponds to the previously discussed structure of FIG. 6.

The electrode segment 50 is indicated in FIG. 3 in dashed lines as overlying the two spaced apart electrode segments 22 and 44. The electrode segment 50 is preferably formed of indium tin oxide deposited on the spaced apart glass substrate 52. The interconnection vias 82, 88, 90, 92 and 94 are also shown in dashed lines in FIG. 3. Tests as discussed above can be conducted on the subassembly 5 of FIG. 3 to determine if the isolation devices 18, 20 and 40, 42 operate properly. In the event that one of the pairs 18, 20 or 40, 42 does not test properly, the corresponding diodes can be disconnected using localized laser induced heating and the respective pairs of redundant isolation devices 24, 30 or 46, 48 can be activated by applying a current limited breakdown voltage across the address lines to breakdown the reverse biased switching diodes, such as 28 and 34. Alternately, the switching diodes 28 or 34 for example can be heated and fused or short circuited using laser energy.

It will be understood that the diodes such as 18, 20, 26 or 28 could all be formed with anodes and cathodes interchanged without departing from the spirit and scope of the present invention.

Figure 7A:
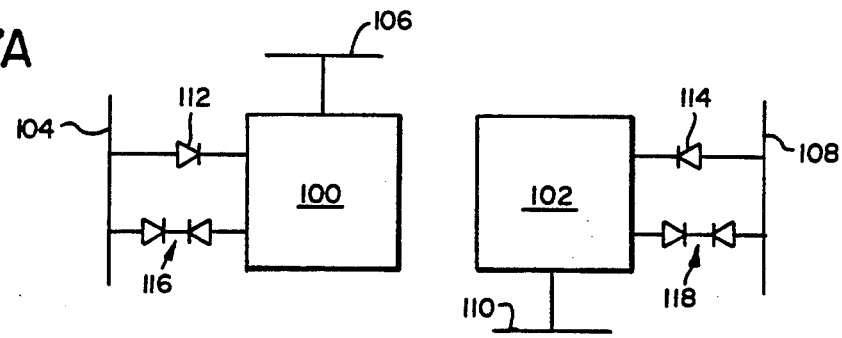
FIG. 7A is a partly diagrammatic, partly schematic view of an alternate embodiment of the present invention.

FIG. 7 illustrates several alternate embodiments of the invention. In FIG. 7A, electrode segments 100, 102 are addressable by address lines 104, 106; 108, 110 respectively. An isolation diode 112 connects the address line 104 to the electrode segment 100. A second isolation diode 114 connects the address line 108 to the electrode segment 102. The structure of FIG. 7A may also be tested prior to the completion of manufacturing and assembly using the previously disclosed method used to test the subassembly 5. Electrical potentials can be applied between the lines 104, 106 to test the diode 112 and the electrode segment 100. Potentials can be applied between the lines 108 and 110 to test the diode 114 and the electrode segment 102.

Redundant isolation structures 116 and 118 can be included in the event either diode 112 or 114 is defective. The redundant isolation structures 116, 118 can be used to replace the isolation diodes 112 or 114 if necessary. Under normal operating conditions, a potential of one polarity can be applied across lines 104 and 110 and a potential of the reversible polarity can be applied across lines 108 and 106 so as to reverse the polarity applied to the nematic liquid crystal fluid in the display.

Figure 7B:
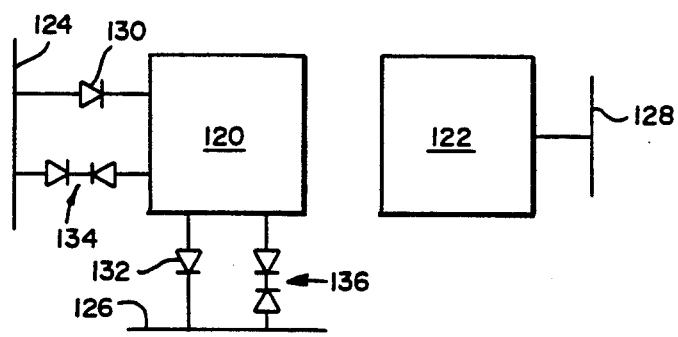
FIG. 7B is a partly diagrammatic, partly schematic diagram of an alternate embodiment of the present invention.
Figure 8:
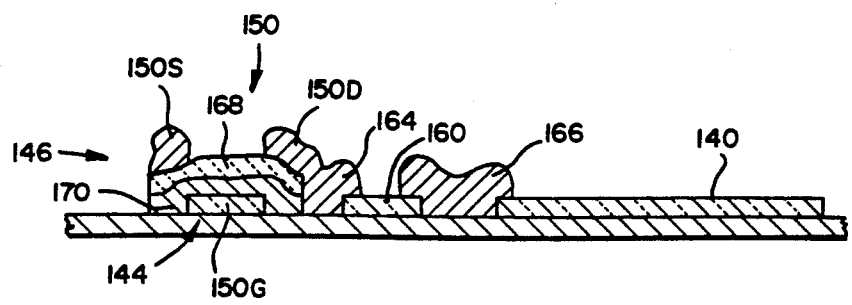
FIG. 8 is a view in section of the structure of one of the isolation devices of FIG. 7C.

Yet another embodiment is shown in FIG. 7B. A pair of electrode segments 120 and 122 is shown in FIG. 7B connected respectively to address lines 124, 126 and 128. The address line 124 is connected to the electrode segment 120 through a diode 130. The address line 126 is connected to the electrode segment 120 through a diode 132.

The structure of the address lines 124, 126, the isolation devices 130, 132 and the electrode segment 120 corresponds to the structure of the address lines 12, 14, the isolation devices 18, 20 and the electrode segment 22 of FIG. 1 and may be tested in the same way as the subassembly 5 of FIG. 1 may be tested. Additionally, if desired, redundant isolation structures 134 and 136 corresponding to redundant isolation structures 24 and 30 can be formed in parallel with the diodes 130 and 132. Under normal operating conditions the subassembly of FIG. 7B can be operated by applying a voltage with a first polarity between the lines 124 and 128 and a voltage of the reverse polarity between the lines 126 and 128 so as to reverse the field applied to the nematic liquid crystal material during each half frame.

Figure 7C:
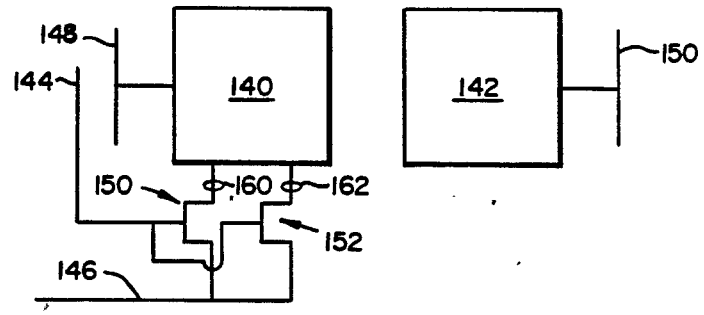
FIG. 7C is a partly diagrammatic, partly schematic view of yet another alternate embodiment of the present invention.

FIG. 7C illustrates yet another embodiment of the present invention. In FIG. 7C electrode segments 140, 142 are connected to a set of address lines 144, 146, 148 and 150 respectively. Address lines 144 and 146 are connected to the electrode segment 140 through thin film field effect transistors 150 and 152. The field effect transistors 150 and 152 are an alternate isolation device to the diodes used in the embodiments of FIGS. 1, 7A and 7B. Connected in series with the field effect thin film transistor 150 is a thin film deposit 160. A similar thin film deposit 162 is connected in series between the transistor 152 and the electrode 140. The thin film deposits 160, 162 are switching elements preferably formed from a settable chalcogenide material which can be set from a substantially non-conducting state to a substantially highly conducting state through the use of either radiant or electrical energy.

One of the transistors 150 or 152 can be selected by setting its respective switching element 160 or 162 to a substantially highly conducting state. The respective transistor can then be tested using the lines 144, 146 and 148. If the transistor 150 is inoperative, it can be disconnected from the pixel electrode 140 by means of directed radiant energy, such as a laser beam, or by localized electrical heating used to vaporize a connection between the transistor 150 and the electrode segment 140. The redundant transistor 152 can then be selected by setting its switching element 162 to its substantially conducting state.

The transistors 150, 152 can be deposited thin film field effect transistors of a type as disclosed in U.S. patent application Ser. No. 609,640, filed May 14, 1984 entitled "Thin Film Field Effect Transistor and Method of Making Same" and assigned to the Assignee of the present invention. The switching elements 160, 162 can be formed of chalcogenide materials as disclosed in U.S. Pat. No. 3,530,441 entitled "Method and Apparatus for Storing and Retrieving Information" issued Sept. 22, 1970 and assigned to the Assignee of the present invention. The disclosure of said patent application and said issued patent are hereby incorporated by reference.

In normal operation, an alternating potential can be applied across electrode segments 140, 142 by applying a selected polarity potential across the lines 146, 150 and by turning on the selected transistor 150 or 152 by a gate voltage on the line 144. The polarity across the lines 146, 150 can then be reversed while gate voltage is again applied to the line 144.

With respect to the embodiments of FIG. 1 previously discussed as well as the above embodiments of FIG. 7, the present invention includes positioning the elements 22, 44 of FIG. 1 in lateral, coplanar, spaced apart relationship as electrode segments as shown in FIG. 1 on the same substrate 10. Alternately the elements 22, 44 can be formed on two substrates vertically spaced apart from one another as pixel electrodes with the nematic fluid positioned therebetween. In the case of the embodiments of FIG. 7A, for example, the elements 100, 102 can either be positioned coplanar and laterally with respect to one another on the same substrate as electrode segments or positioned in spaced apart relationship from one another as pixel electrodes with the nematic fluid located therebetween. The structure of FIG. 7B can also be formed in either physical relationship with the elements 120, 122 corresponding to electrode segments or pixel electrodes respectively. Similarly, the elements 140, 142 of FIG. 7C can be formed as coplanar electrode segments or spaced apart pixel electrodes.

FIG. 8 illustrates in more detail the embodiment of FIG. 7C discussed above. FIG. 8 shows in section the transistor 150 with a source region 150S formed on the address line 146, a gate electrode 150G formed on the address line 144, and a drain region 150D connected via a deposited conductor 164 to the switching element 160 formed as a deposited, settable chalcogenide material. The element 160 is in turn connected to the electrode segment or pixel electrode 140 by a deposited conductor 166. The transistor 150 is a deposited thin film field effect transistor, with an amorphous silicon layer 168 positioned between the source 150S and the drain 150D. An oxide layer 170 insulates the gate electrode 150G from the amorphous semiconductor material 168. The transistor 152 would have a similar structure.

Figure 9:
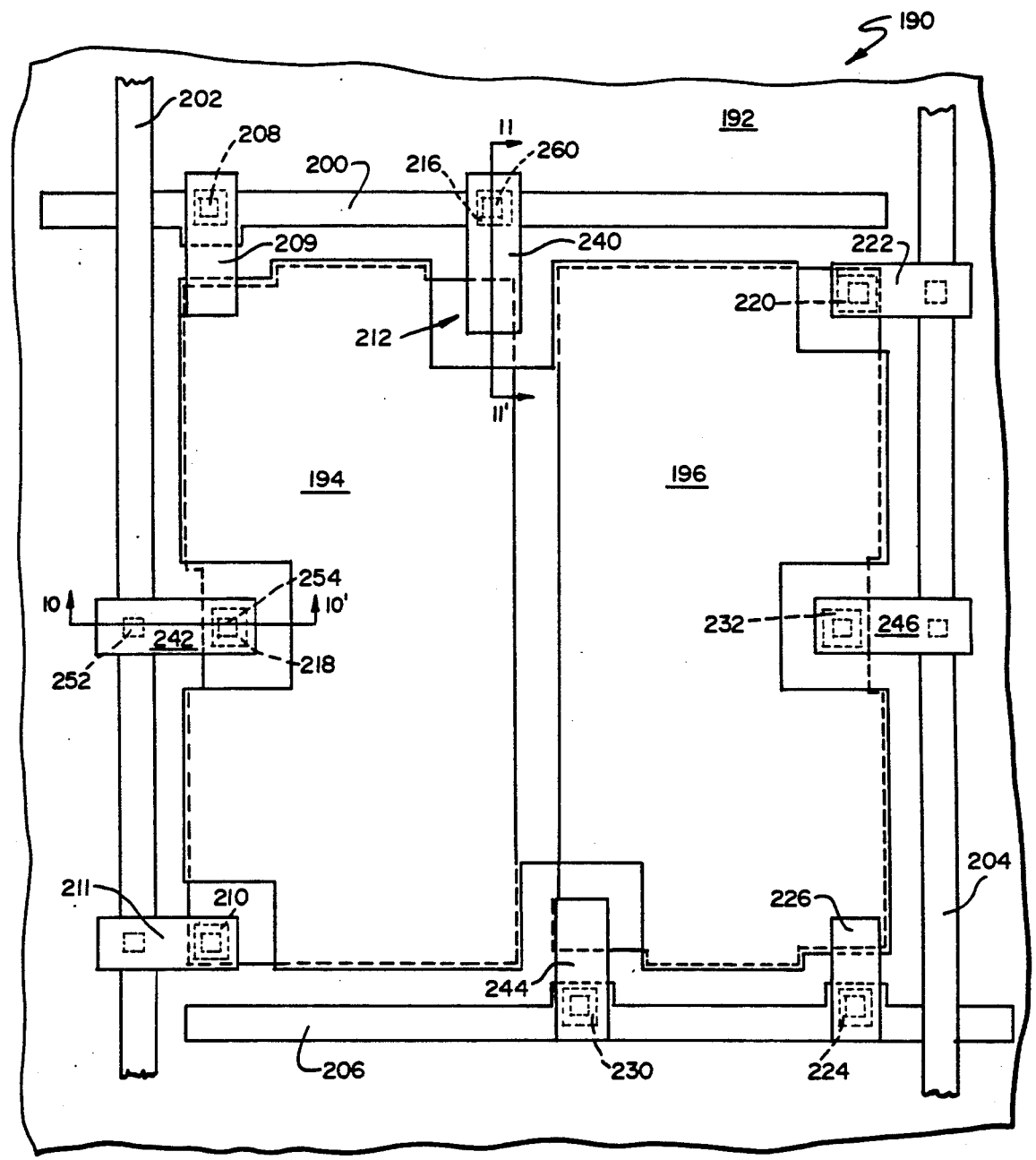
FIG. 9 is a top plan view of a subassembly of a liquid crystal display of another embodiment of the present invention.

FIG. 9 is a top plan view of a subassembly 190 which illustrates yet another embodiment of the present invention. The subassembly 190 includes a transparent substrate 192 which can be formed of glass. A pair of transparent, coplanar, laterally spaced apart, electrode segments 194, 196 corresponding to the electrode segments 22 and 44 of FIG. 1 are formed on the substrate 192. First and second address lines 200, 202 are deposited on the substrate 192 as are the address lines 12 and 14 of FIG. 1 and are associated with the electrode 194. Address lines 204, 206 are also deposited on the substrate 192 and are associated with the electrode segment 196. Isolation diodes 208 and 210, formed on the address line 200 and on a region of the electrode segment 194 respectively correspond to the isolation devices 18, 20 of FIG. 1. A deposited conductor 209 formed of a selected metal as noted above or a doped semiconductor connects the isolation diode 208 to the electrode segment 194. A deposited conductor 211 formed of a selected metal as noted above or a doped semiconductor material connects the diode 210 to the address line 202.

Whereas each of the redundant isolation structures 24, 30 of FIG. 1 included two back-to-back diodes 26, 28; and 32, 34, the redundant isolation structures 212 and 214 of the subassembly 190 each include only a single isolation diode 216 and 218 respectively. The diode 216 is formed on a region of the address line 200. The diode 216 can serve as a replacement for the diode 208. The diode 218 is formed on a region of the electrode segment 194 and can serve as a replacement for the diode 210. However, when the subassembly 190 is first manufactured, the diode 216 is not connected to the electrode segment 194 and the diode 218 is not connected to the address line 202.

The address line 204 is connected to the electrode segment 196 when the subassembly 190 is manufactured by a diode 220 which is formed on a region of the electrode 196 which is in turn connected to the address line 204 by a conductor 222. The diode 220 corresponds in structure to the diode 210. The address bus 206 is connected to the electrode segment 196 when the subassembly 190 is manufactured by a diode 224 which is formed on a region of the address bus 206 and a deposited conductor 226. Diode 224 corresponds to the diode 208. Additionally, the subassembly 192 is initially manufactured with a pair of redundant diodes 230 and 232 formed respectively on a region of the address line 206 and on a region of the electrode segment 196. The diodes 230 and 232 correspond to the redundant diodes 216 and 218. Diodes 230 and 232 when the substrate 190 is initially manufactured, as is the case with the respective diodes 216 and 218, are not connected to the electrode 196 or the address bus 204 respectively.

Once the subassembly 190 has been manufactured, the diodes 208, 210, 220 and 224 can be tested as discussed above by applying potentials to the address lines 200 and 202 as well as the address lines 204, 206. If any of the diode pairs 208, 210 or 222, 224 are determined by testing to be defective they may be disconnected from the electrode segments 194, 196 as discussed previously by localized heating and vaporization of the metal connecting links 209 and 211; or 222 and 226. This corresponds to the use of laser energy to disconnect the diodes 18, 20 or 40, 42 as in FIG. 1.

Once the defective pair of isolation diodes has been disconnected from the electrode segment 194 or the electrode segment 196 the replacement redundant diodes 216, 218; or 230, 232 can be connected. Connection involves a spray and lift off type process which is well known in the art and which may be used to fabricate deposited conductors 240 and 242 which respectively connect the diode 216 to the electrode segment 194 and the diode 218 to the address line 202 or which can be used to fabricate a pair of deposited conductors 244, 246 which will connect the diode 230 to the electrode segment 196 and the diode 232 to the address line 204 respectively. The conductive links 240, 242 or 244, 246 may be formed by first applying a layer of positive photoresist to the subassembly 190. The layer of positive photoresist is exposed using a mask and developed. The portion of the photoresist which is exposed corresponds to those regions of the substrate 190 on which the connectors such as 240 or 242 are to be deposited. The exposed portion of the photoresist is removed. An appropriate metal or doped semiconductor is then deposited onto the substrate 190 to form a layer thereon. Metals such as aluminum, molybdenum, an alloy of molybdenum and tantalum, chromium, tantalum, tungsten, palladium or platinum may be used. After the metal has been deposited onto the exposed photoresist the excess material is removed from the substrate 190 as is well known in the art. The material that remains corresponds to the connectors 240, 242 or 244, 246.

The cross-sectional structures of the diode 208 and the connector 209 with respect to the electrode segment 194 correspond to the structure of the diode 18 and the connector 19 of FIGS. 3 and 4. The structures of the isolation diode 210 and the connector 211 with respect to the electrode segment 194 correspond to the structures of the diode 20 and the connector 62 of FIGS. 3 and 6.

Figure 10:
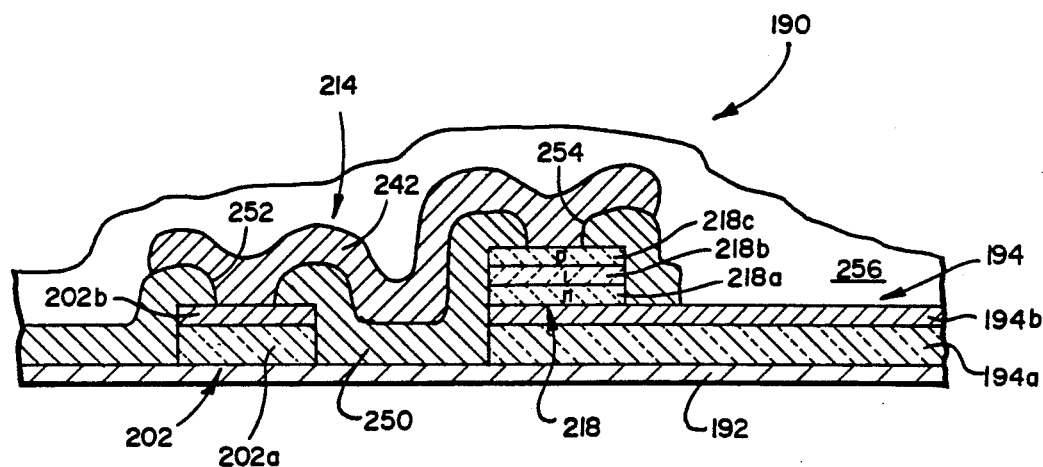
FIG. 10 is a sectional view taken along line 10—10' of FIG. 9.

FIG. 10 is a sectional view taken along line 10—10' of FIG. 9 which shows the structure of the redundant element 214 including the diode 218 and its related conductor or connector 242, once that connector has been deposited, with respect to the electrode segment 194. The electrode segment 194 is formed by depositing a layer 194a of indium tin oxide on the substrate 192. A layer of chromium 194b is then deposited on top of the indium tin oxide. Similarly the address line 202 is formed of a layer 202a of indium tin oxide deposited onto the substrate 192 and a layer 202b of chromium deposited on the indium tin oxide. The redundant isolation diode 218, is formed out of amorphous silicon alloy as discussed above with respect to the diodes 18, 20 of FIG. 1 with an n-doped layer 218a formed on the chromium layer 194b, an intrinsic layer 218b formed above and overlying the n-doped layer 218a and a p-doped layer 218c overlying the intrinsic layer 218b. An insulating layer 250 corresponding to the insulating layer 80 of FIGS. 3 through 6 is then deposited forming vias 252 and 254 which expose regions of the address line 202 and the diode 218. The deposited connector 242 couples the address line 202 to the diode 218. A transparent passivating layer 256 corresponding to the passivating layer 86 of FIGS. 4 through 6 then covers and protects the subassembly 190.

Figure 11:
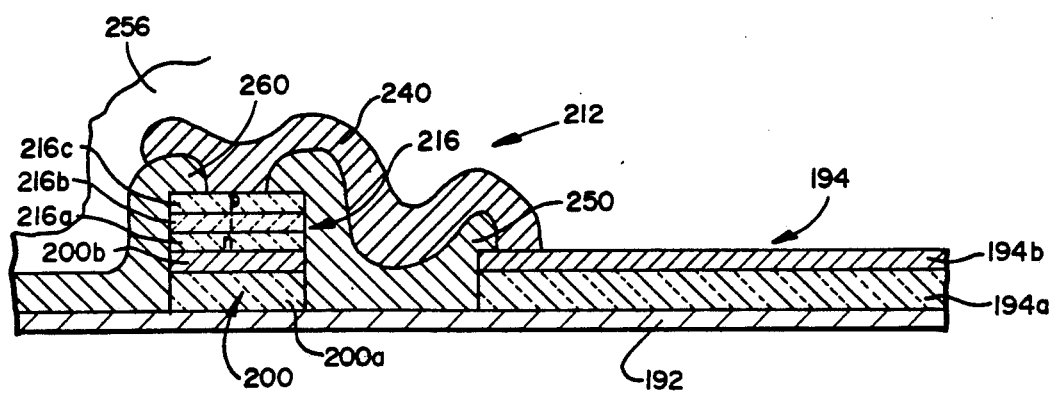
FIG. 11 is a sectional view taken along line 11—11' of FIG. 9.

FIG. 11 is a sectional view taken along line 11—11' of FIG. 9 and illustrates the structure of redundant element 212 including the diode 216, and associated connector 240, once that connector has been deposited, with respect to the electrode segment 194. The address line 200 is formed of a layer of indium tin oxide 200a deposited on the substrate 192 with a layer of chromium 200b formed thereon. The diode 216 is formed of amorphous silicon alloy with an n-doped region or layer 216a formed on the address line 200, an intrinsic region or layer 216b and a p-doped region or layer 216c formed overlying the intrinsic region. The insulating layer 250 forms a via 260 through which the deposited metal or semiconductor 240 extends in contact with the anode 216c of the diode 216 thereby coupling it to the electrode 194. The passivating layer 256 is also shown in FIG. 11 covering the electronic structure.

With respect to the diodes associated with electrode segment 196, the structure of the diode 220 corresponds to the structure of the diode 210. The structure of the diode 224 corresponds to the structure of the diode 208. The structures of redundant diodes 230 and 232 correspond to the structures of redundant diodes 216 of FIG. 11 and 218 of FIG. 10 respectively.

The subassembly 190 has the same advantages as does the subassembly 5 in permitting rapid testing during the manufacturing process and in providing for redundant isolation devices which can be used to replace defective isolation devices. As with the subassembly 5, the redundant isolation devices 216 and 218 of FIG. 9 have been positioned as far as possible from their corresponding primary isolation devices 208 and 210 respectively so as to minimize the chances of dual failure do to mechanical problems such as dust or other dirt having fallen on the substrate 190 during the manufacturing process.

Figure 12A:
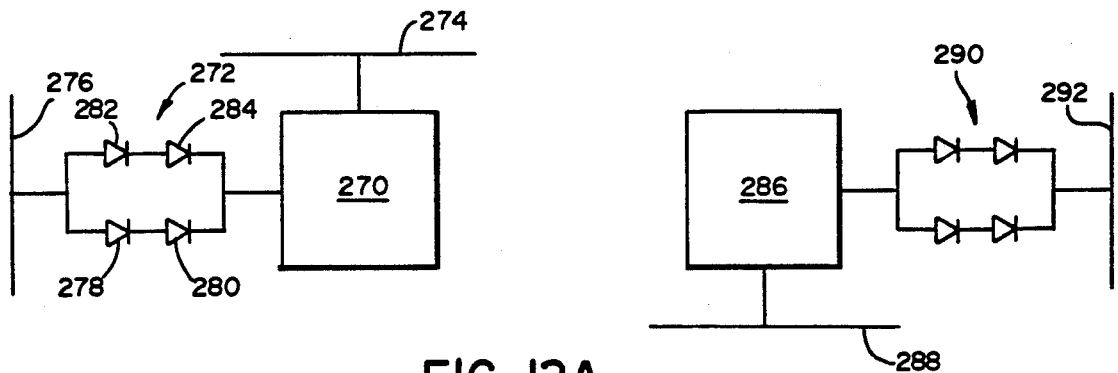
FIG. 12A is a partly diagrammatic, partly schematic view of an alternate embodiment of the present invention.

FIG. 12 illustrates several alternate embodiments of the present invention. In FIG. 12A an electrode segment 270 is connected to a redundant isolation structure 272 and to an address line 274. A second address line 276 is connected to the structure 272. The structure 272 is formed of diodes 278, 280 connected in series in the same relation and diodes 282, 284 connected in series in the same relation. The diodes 278, 280 are connected in parallel with the diodes 282, 284.

The structure 272 has a self-selecting redundancy characteristic. Since diode pair 278, 280 is in parallel with diode pair 282, 284 if one of the diodes 278 or 280 is an open circuit, the diodes 282, 284 will function independently to enable the address line 276 to continue to address the electrode 270. Analogously, if diode 278 or 280 is short circuited, the other diode 280 or 278 will still function as an isolation device when the electrode 270 is not being addressed.

A second electrode segment 286 spaced apart from the electrode 270 is connected to a third address line 288 and a second redundant structure 290. The structure 290 is connected to a fourth address line 292. The structure 290 is identical to the structure 272 and functions in the same way.

Figure 12B:
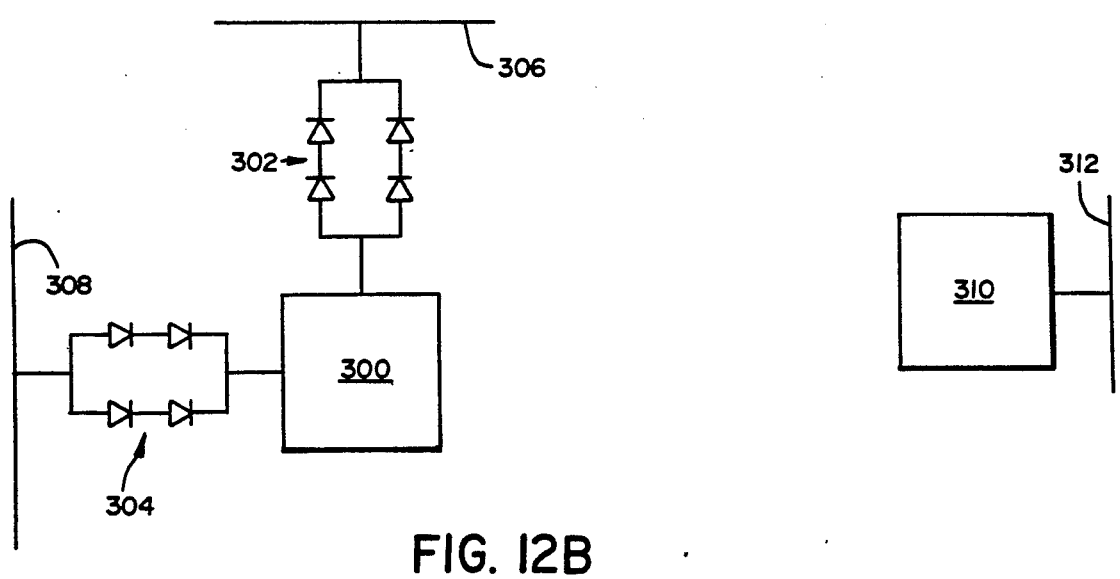
FIG. 12B is a partly diagrammatic, partly schematic view of an alternate embodiment of the present invention.

FIG. 12B illustrates yet another embodiment of the invention with self-selecting redundancy that requires no testing. An electrode segment 300 is connected to first and second redundant isolation structures 302 and 304. The structures 302, 304 are in turn connected to address lines 306, 308 respectively. The structures 302, 304 are identical to and function as does the redundant isolation structure 272. A second electrode 310 coplanar with and spaced apart from the electrode 300 is connected to an address line 312.

The electrodes 270 and 286 of FIG. 12A and the pair of electrodes 300, 310 of FIG. 12B can be formed as electrode segments coplanar and spaced apart from one another on a substrate. A third electrode such as the electrode segment 50 of FIGS. 1 and 2 can be formed in spaced apart relation therewith. The region, such as the region 54 therebetween, can be filled with a light influencing material such as nematic liquid crystal fluid. Alternately, the electrodes 270 and 286, or 300 and 310 can be formed as pixel electrodes on two substrates in spaced apart relation to one another with light influencing material therebetween. As used herein the term "electrode" refers to either an electrode segment or a pixel electrode.

Figure 12C:
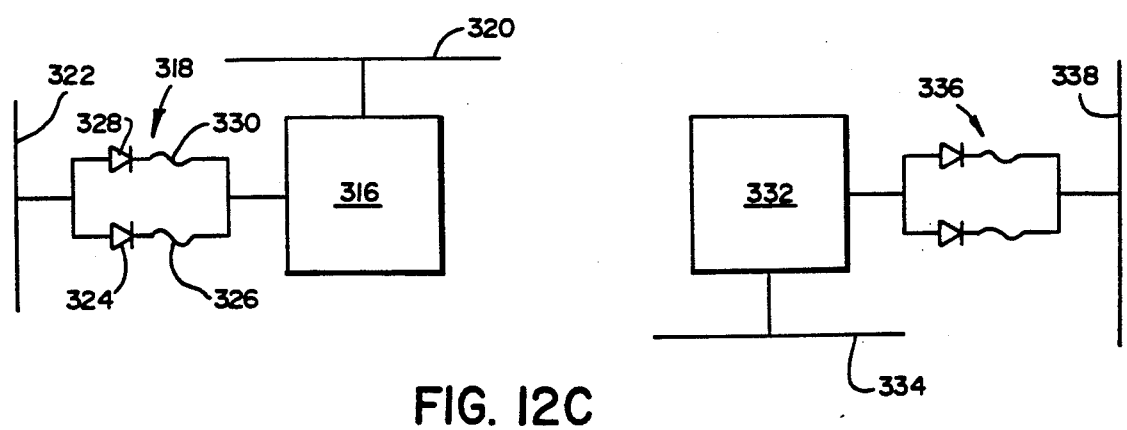
FIG. 12C is a partly diagrammatic, partly schematic view of an alternate embodiment of the present invention.

FIG. 12C illustrates yet another embodiment of the present invention also including self-selecting redundancy. An electrode 316 is connected to a redundant isolation structure 318 and to an address line 320. The redundant isolation structure 318 is in turn connected to an address line 322. The structure 318 is formed of a diode 324 in series with a thin film fuse 326. The series combination of the diode 324 and fuse 326 is connected in parallel with a redundant diode 328 and fuse 330. The fuses 326, 330 are formed of a deposited nickel-chromium alloy.

A second electrode 332 can be formed on the same subassembly as the electrode 316. The electrode 332 is connected to an address line 334 and a redundant isolation structure 336. The structure 336 is identical to the structure 318 and is in turn connected to an address line 338. With respect to redundant isolation structure 318, in normal operation, if the polarity of the address line 322 is positive with respect to the line 334 either 324 or 328 or both will be forward biased to apply a potential to the electrode 316. Hence, both diodes 324, 328 must be an open circuit to render electrode 316 inoperative. If the polarity of the line 320 is positive with respect to the line 322, as will happen in normal operation, the diodes 324 and 328 should be reverse biased. If either 324 or 328 is a short circuit, the reverse current flowing through the link 326 or 330 will vaporize the link automatically disconnecting the shorted diode from the electrode 316. The structure 336 operates in the same way. The electrodes 316, 332 can be formed on a common substrate as coplanar spaced apart electrode segments or formed spaced apart as pixel electrodes with light influencing material therebetween.

Hence, the structures of FIG. 12 includes self-selecting redundancy. No separate test step is necessary in the manufacture thereof. A typical thickness for the thin film fuses 326, 330 would be on the order of 500 angstroms to 1 micron.

Figure 13A:
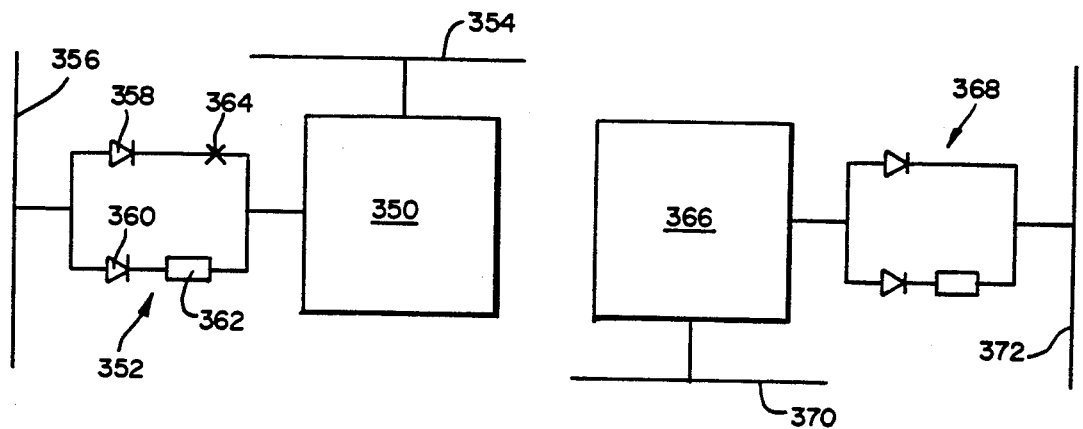
FIG. 13A is a partly diagrammatic, partly schematic view of an alternate embodiment of the present invention.

FIG. 13A illustrates yet another embodiment of the present invention. In FIG. 13A an electrode 350 is coupled to a redundant isolation structure 352 and an address line 354. The isolation structure 352 is in turn connected to a second address line 356. The redundant isolation structure 352 includes an isolation diode 358 which is connected in parallel with a series connected redundant isolation diode 360 and a switching device or antifuse 362. The switching device 362 represents a normally open circuited element or an element of low conductivity. In the event that the diode 358 is determined to be defective, the diode 358 can be disconnected from the electrode 350 by means of laser induced heating of a connection 364 between the cathode of the diode 358 and the electrode 350. Once the diode 358 has been disconnected the switching element 362 can be set or switched into its highly conducting state such that the redundant diode 360 can be used to address the electrode 350.

A second electrode 366 is also illustrated in FIG. 13A and is connected to a redundant isolation structure 368 as well as an address line 370. The redundant isolation structure 368 is in turn also connected to a second address line 372. The redundant isolation structure 368 is identical to and functions the same as the redundant isolation structure 352.

As discussed previously with respect to the earlier embodiments, the electrodes 350 and 366 can be formed on a common substrate, spaced apart and essentially coplanar with one another thereby forming electrode segments which cooperate with a third common electrode segment which is spaced apart from segments 350 and 366. A light influencing material can be placed in the region between the common electrode and the electrode segments. Alternately the electrodes 350 and 366 can be used as pixel electrodes directly by forming them in spaced apart relationship with a light influencing material such as a nematic liquid crystal material positionable therebetween.

Figure 13B:
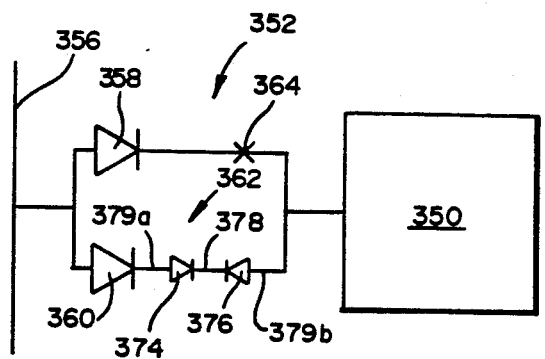
FIG. 13B is a partly diagrammatic, partly schematic view of an alternate embodiment of the present invention.

FIG. 13B illustrates an embodiment of the switching element 362. The same identification numerals are used in FIG. 13B as one used in FIG. 13A to identify common elements. The antifuse or switching element 362 can be formed of two diodes 374, 376 series connected in reverse relation which are in turn series connected with the redundant isolation diode 360. The diodes 360, 374, 376 of the redundant isolation structure 352 can be formed of a deposited amorphous silicon alloy. In such an embodiment the diodes 358 and 360 will have a three layer p-i-n structure and be approximately 30 microns by 30 microns. On the other hand the diodes 374, 376 of the switching element 362 are formed so as to be 10 microns on a side by 20 microns long. Such diodes will be on the order of 4,000 angstroms thick. The switching element 362 has the advantage that the diodes 374 and 376 are substantially smaller in area than either of the diodes 358 or 360. As a result, the yield will be substantially increased during the manufacturing process since the smaller cross-sectional area of the diodes 374, 376 makes them much less susceptible to having foreign matter fall thereon and produce a short circuit.

Figure 13C:
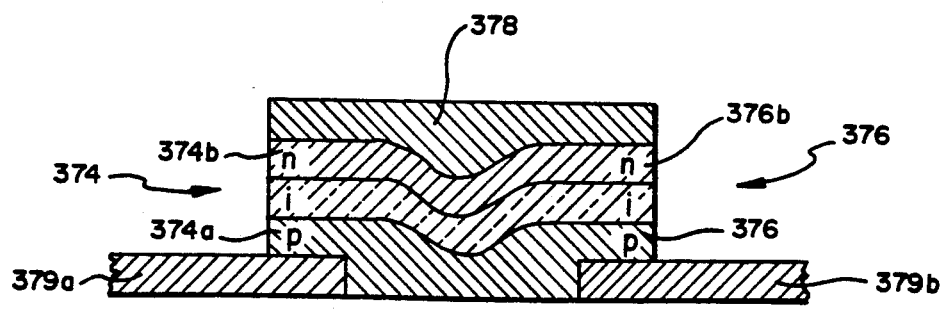
FIG. 13C is a view in section of the switching element of FIG. 13B.

FIG. 13C illustrates in section the structure of the diodes 374, 376. The diodes 374, 376 are formed on spaced apart conductors 379a, b and each has an anode 374a, 376a indicated as a p-type region in contact therewith. The cathodes 374b, 376b of the diodes 374, 376 are interconnected by a deposited metal layer 378. The diodes 374, 376 are formed as p-i-n diodes at the same time as the diodes 358 and 360 are formed. In the event that it determined that the diode 358 is not operational. Radiant energy in the form of a laser beam can be used to heat and vaporize the connection 364 disconnecting the diode 358 from the electrode 350. The laser beam can also be used to heat and fuse the diode 376, and if desired the diode 374, thereby coupling the diode 360 to the electrode element 350. The advantage of forming the dual diode structure 374, 376 is that no additional processing steps will be necessary to create the diodes 374, 376. Further, because of the smaller size of the diodes 374, 376 as discussed above, the manufacturing yield will be increased.

Figure 14A:
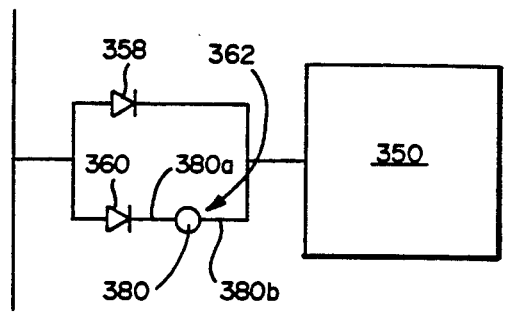
FIG. 14A is a partly diagrammatic, partly schematic view of an alternate embodiment of the present invention.

FIG. 14A illustrates yet another form of switching element 362. In FIG. 14A the switching element 362 is formed of an antifuse 380. FIG. 14B illustrates one embodiment of the antifuse 380. The antifuse 380 shown in FIG. 14B is formed on deposited metal contacts 380a and 380b as a three layer 382, 384, 386 p-i-n amorphous silicon resistive element. The antifuse 380 of FIG. 14B exhibits a high resistivity, on the order of $10^4$ ohms per centimeter. If the diode 358 is functioning correctly, the deposited metal connectors 380a and 380b are connected through the high resistance, low conductivity p-type amorphous silicon layer 382. The p-type layer 382 is about 500 angstroms thick. The space between the conductors 380a and 380b is on the order of 10 microns as is the overlap of the layer 382 on the conductors 380a and 380b. The element 380 can be deposited during the manufacturing process when the diodes 358 and 360 are being deposited and will require no additional steps. In the event that the diode 358 is defective it may be disconnected from the electrode 350 by means of radiant energy vaporizing the connection 364 as discussed above. Subsequently, the element 380 can be fused by radiant energy, such as by a laser directed thereat and its resistivity will be reduced to 0.1 to 1 ohm per centimeter. In this condition, the entire three level structure 382 through 386 becomes a conductor connecting the elements 380a and 380b together. This results in 6 orders of magnitude difference in the resistance between the elements 380a and 380b before fusing as opposed to the resistance after fusing.

Figure 14C:
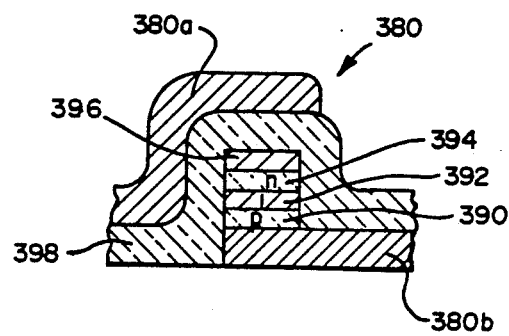
FIG. 14C is a view in section of an embodiment of the switching element of FIG. 14A.
Figure 14B:
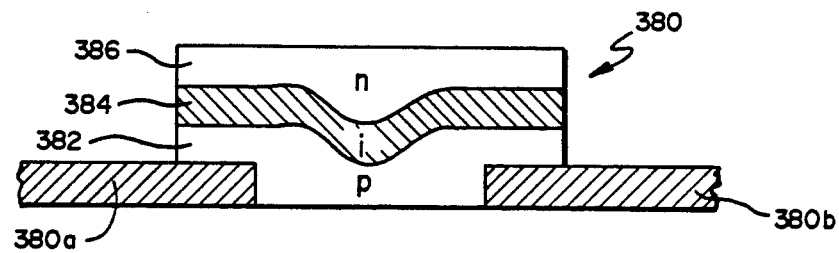
FIG. 14B is a view in section of an embodiment of the switching element of FIG. 14A.

FIG. 14C illustrates another embodiment of the antifuse 380. In FIG. 14C a p-i-n diode having 3 layers, 390 through 394 is formed on the metallic conductor 380b. A top metal layer 396 is formed on the diode structure 390 through 394. A silicon dioxide layer 398 insulates the adjacent metal conductor 380a from the four layer structure 390 through 396 as well as the metal conductor 380b. When it is desirable to use the diode 360 to address the electrode 350 the antifuse 380 element of FIG. 14C can be fused by radiant energy, such by a laser thereby connecting the metal conductor 380a to the conductor 380b. The three layer diode structure 390 through 394 again has the advantage that it may be formed during the same processing operations as are used to form the diodes 358 and 360.

Figure 14D:
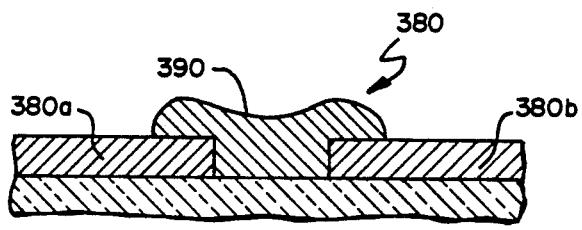
FIG. 14D is a view in section of an embodiment of the switching element of FIG. 14A.

FIG. 14D illustrates yet another embodiment of the switching element 380. FIG. 14D the deposited metal conductors 380a and 380b are separated by an approximately 10 micron interval wherein is deposited a settable chalcogenide material 390. In the event that the diode 358 becomes unusable the material 390 can be set from its low conductivity state to its high conductivity state thereby connecting the diode 360 to the electrode 350. Chalcogenide materials of the type disclosed in the '441 patent referenced above may be used as the element 390.

Figure 14E:
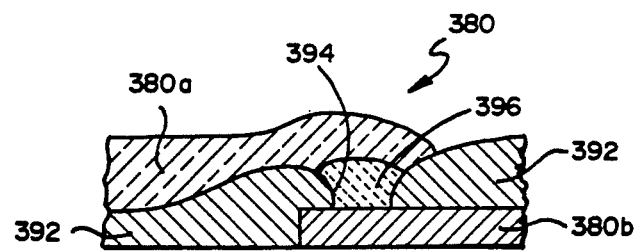
FIG. 14E is a view in section of an embodiment of the switching element of FIG. 14A.

FIG. 14E illustrates a vertical form of the switching element 380. In FIG. 14E a silicon dioxide layer 392 or other equivalent insulator is formed on the conductor 380b. A via 394 is formed in the insulating layer 392. Chalcogenide material 396 is deposited in the via 394 and contacts the conductor 380b. The second metal conductor 380a is deposited over the insulating layer 392 and the settable chalcogenide layer 396. In the event that the diode 358 becomes inoperative the chalcogenide element 396 can be set to its high conductivity state from its low conductivity state by the application of radiant energy such as by a laser beam directed thereon.

It will be understood and recognized that the subassemblies of FIGS. 1–14 can be combined in completed liquid crystal displays having a large number of pixels rather than just the one pixel as disclosed herein. It will also be further appreciated that the present invention can be practiced otherwise than as specifically disclosed herein. For example, the diodes can be formed from deposited semiconductor materials other than amorphous semiconductor alloys. The diodes can be formed of polycrystalline semiconductor diodes as can the isolation transistors. The amorphous semiconductor alloy diodes can be formed from other material configurations than the p-i-n or n-i-p configuration described herein. For example, configurations such as p-π-n, p-νn, p-n where the π and the ν refer to lightly doped p and n-type semiconductor material respectively. Also, if high voltage turn-on is desired for the pixels, the diodes can be formed in a stacked or tandem configuration. Further, the scope of the invention includes all types of transistors that can be deposited and which will provide the proper isolation characteristics. The scope of the invention includes the use of all types of light influencing materials as discussed herein.

We claim:

1. A subassembly for use in making a display of a type incorporating a light influencing material, the subassembly comprising:
   a substrate;
   a plurality of electrodes formed on said substrate in spaced apart relation;
   at least one first isolation device formed on said substrate and coupled to a respective electrode of said plurality of electrodes; and
   addressing means formed on said substrate for enabling the selective application of electrical potentials to each said isolation device to enable the selective testing of said isolation devices.

2. A subassembly as defined in claim 1 wherein said addressing means include first and second sets of address lines and wherein each said first isolation device is coupled between a respective different pair of address lines of said first and second sets of address lines.

3. A subassembly as defined in claim 2 wherein each said first isolation device, each said respective electrode and said respective pair of address lines are coupled in series relation.

4. A subassembly as defined in claim 1 wherein said isolation devices comprise diodes.

5. A subassembly as defined in claim 4 wherein said diodes are formed from semiconductor materials.

6. A subassembly as defined in claim 5 wherein said semiconductor materials are deposited semiconductor materials.

7. A subassembly as defined in claim 6 wherein said deposited semiconductor materials are amorphous semiconductor alloys.

8. A subassembly as defined in claim 7 wherein said diodes include a first doped region, an intrinsic region overlying said first doped region, and a second doped region overlying said intrinsic region.

9. A subassembly as defined in claim 8 wherein said first and second doped regions are opposite in conductivity.

10. A subassembly as defined in claim 1 wherein said isolation devices comprise field effect transistors.

11. A subassembly as defined in claim 10 wherein said field effect transistors are thin film field effect transistors including semiconductor materials.

12. A subassembly as defined in claim 11 wherein said semiconductor materials are deposited semiconductor materials.

13. A subassembly as defined in claim 12 wherein said deposited semiconductor materials are amorphous semiconductor alloys.

14. A subassembly as defined in claim 1 further including at least one redundant isolation device associated with at least one of said first isolation devices, each of said redundant isolation devices being arranged to replace its associated first isolation device.

15. A subassembly as defined in claim 14 wherein each of said first isolation devices is coupled between said respective electrode and said addressing means.

16. A subassembly as defined in claim 15 wherein each of said redundant isolation devices is arranged to be coupled between its respective electrode and said addressing means and wherein each of said first isolation devices is arranged to be uncoupled from electrical connection between its associated electrode and said addressing means.

17. A subassembly as defined in claim 16 further including switching means coupled in series relation with each said redundant device.

18. A subassembly as defined in claim 17 wherein said switching means are arranged for coupling selected ones of said redundant devices between their associated electrodes and said addressing means.

19. A subassembly as defined in claim 18 wherein each said switching means is arranged to be short circuited for coupling its associated redundant device between its respective electrode and said addressing means.

20. A subassembly as defined in claim 19 wherein selected ones of said switching means each include a diode arranged to be electrically short circuited.

21. A subassembly as defined in claim 19 wherein selected ones of said switching means each include a diode arranged to be short circuited with radiant energy.

22. A subassembly as defined in claim 21 wherein said radiant energy is laser energy.

23. A subassembly as defined in claim 19 wherein selected ones of said switching means include a settable material arranged to be electrically short circuited.

24. A subassembly as defined in claim 19 wherein selected of said switching means include a settable material arranged to be short circuited with radiant energy.

25. A subassembly as defined in claim 16 wherein said first isolation devices are arranged to be uncoupled from electrical connection between their associated electrodes and said addressing means by the application of radiant energy.

26. A subassembly as defined in claim 25 wherein said radiant energy is laser energy.

27. A subassembly as defined in claim 17 wherein said first and redundant devices are formed from semiconductor materials.

28. A subassembly as defined in claim 27 wherein said switching means include semiconductor materials.

29. A subassembly as defined in claim 28 wherein said semiconductor materials are deposited semiconductor materials.

30. A subassembly as defined in claim 29 wherein said deposited semiconductor materials are amorphous semiconductor alloys.

31. A subassembly as defined in claim 16 wherein said first and redundant isolation devices comprise diodes.

32. A subassembly as defined in claim 16 wherein said first and redundant isolation devices comprise thin film field effect transistors.

33. A subassembly as defined in claim 1 including at least one second isolation device coupled to said respective electrode from said plurality of electrodes; and addressing means for enabling the selective application of electrical potentials to each respective pair of said isolation devices to enable the selective testing of said isolation devices.

34. A subassembly as defined in claim 33 wherein said addressing means include first and second sets of address lines and wherein each said pair of isolation devices is coupled between a respective different pair of address lines of said first and second sets of address lines.

35. A subassembly as defined in claim 34 wherein said first isolation devices of each said pair of isolation devices are coupled in series relation between said respective different pairs of address lines of said first and second sets of address lines.

36. A subassembly as defined in claim 35 wherein the isolation devices of each said pair of isolation devices are coupled together at a common node and wherein said common node of said isolation devices is coupled to the electrode associated therewith.

37. A subassembly as defined in claim 36 wherein each said pair of isolation devices is series coupled to said associated electrode.

38. A subassembly as defined in claim 34 wherein said first and second isolation devices of each said pair are series coupled to said respective electrode and series coupled between a respective one of said different pairs of first and second address lines.

39. A subassembly as defined in claim 33 wherein said isolation devices comprise diodes.

40. A subassembly as defined in claim 39 wherein said diodes are formed from semiconductor materials.

41. A subassembly as defined in claim 40 wherein said semiconductor materials are deposited semiconductor materials.

42. A subassembly as defined in claim 41 wherein said deposited semiconductor materials are amorphous semiconductor alloys.

43. A subassembly as defined in claim 42 wherein said amorphous semiconductor alloys include silicon.

44. A subassembly as defined in claim 42 wherein said amorphous semiconductor alloys include hydrogen.

45. A subassembly as defined in claim 42 wherein said amorphous semiconductor alloys include fluorine.

46. A subassembly as defined in claim 40 wherein said diodes include a first doped region, an intrinsic region overlying said first doped region, and a second doped region overlying said intrinsic region.

47. A subassembly as defined in claim 46 wherein said first and second doped regions are opposite in conductivity.

48. A subassembly as defined in claim 33 further including a pair of redundant isolation devices associated with each said pair of isolation devices, each said redundant isolation device corresponding to a corresponding one of said isolation devices, each of said redundant isolation devices being arranged to replace its corresponding isolation device.

49. A subassembly as defined in claim 48 wherein each of said first isolation devices is coupled between its respective electrode and said addressing means.

50. A subassembly as defined in claim 49 wherein each of said redundant isolation devices is arranged to be coupled between its respective electrode and said addressing means and wherein each of said first isolation devices is arranged to be uncoupled from electrical connection between its associated electrode and said addressing means.

51. A subassembly as defined in claim 50 wherein said first isolation devices are arranged to be optically uncoupled with radiant energy from electrical connection between their associated electrodes and said addressing means.

52. A subassembly as defined in claim 51 wherein said radiant energy is laser energy.

53. A subassembly as defined in claim 48 wherein said first and redundant isolation devices comprise diodes.

54. A subassembly as defined in claim 53 further including a plurality of switching devices, each switching device being coupled to a respective said redundant diode.

55. A subassembly as defined in claim 54 wherein each said switch device is arranged to be short circuited for coupling its associated redundant diode between its respective electrode and said addressing means.

56. A subassembly as defined in claim 55 wherein said first and redundant diodes and said switching devices are formed from semiconductor materials.

57. A subassembly as defined in claim 56 wherein said semiconductor materials are deposited semiconductor materials.

58. A subassembly as defined in claim 57 wherein said deposited semiconductor materials are amorphous semiconductor alloys.

59. A subassembly as defined in claim 58 wherein said switching devices are arranged to be electrically short circuited.

60. A subassembly as defined in claim 58 wherein said switching diodes are arranged to be short circuited with radiant energy.

61. A subassembly as defined in claim 58 wherein said radiant energy is laser energy.

62. A subassembly for use in making a display of a type incorporating a light influencing material, the subassembly comprising:
first and second means for addressing;
means for isolation coupled to said first means for addressing; and
a first electrode connected to said second means for addressing and directly to said means for isolation.

63. A subassembly as defined in claim 62 further including a substrate with said first and second means for addressing, said means for isolation and said electrode formed thereon.

64. A subassembly as defined in claim 63 wherein said means for isolation iclude a diode.

65. A subassembly as defined in claim 64 including second means for isolation coupled between said pixel electrode and said second means for addressing.

66. A subassembly as defined in claim 65 wherein said second means for isolation include a diode.

67. A subassembly as defined in claim 65 including second redundant means for isolation arranged to replace said second means for isolation.

68. A subassembly as defined in claim 63 including a second electrode spaced apart and coplanar to said first electrode, said first and second electrodes forming electrode segments, and means for coupling to said second electrode segment.

69. A subassembly as defined in claim 68 wherein said means for coulping include third and fourth means for addressing with said second electrode segment coupled therebetween.

70. A subassembly as defined in claim 69 wherein said third means for addressing include second means for isolation coupled to said second electrode segment.

71. A subassembly as defined in claim 70 wherein said second means for isolation include a diode.

72. A subassembly as defined in claim 71 including first redundant means for isolation arranged to replace said means for isolation and second redundant means for isolation arranged to replace said second means for isolation.

73. A subassembly as defined in claim 72 wherein said means for isolation and said second means for isolation each include a diode.

74. A subassembly as defined in claim 62 including redundant means for isolation arranged to replace said means for isolation.

75. A subassembly as defined in claim 74 wherein said means for isolation include a diode and said redundant means for isolation include a diode series coupled with a switching means.

76. A subassembly as defined in claim 75 wherein said switching means include first and second diodes series coupled in reverse relation.

77. A subassembly as defined in claim 75 wherein said switching means include an anti-fuse settable from a comparatively non-conducting state to a highly conducting state.

78. A subassembly as defined in claim 77 wherein said anti-fuse includes a diode arranged to be short circuited.

79. A subassembly as defined in claim 77 wherein said anti-fuse is settable to a comparatively highly conductive state by means of radiant energy.

80. A subassembly as defined in claim 79 wherein said anti-fuse includes deposited semiconductor material.

81. A subassembly as defined in claim 77 wherein said switching means include two diodes series coupled in reverse relation.

82. A subassembly as defined in claim 77 wherein said switching means include a selected material settable from a comparatively non-conducting state to a highly conducting state.

83. A subassembly as defined in claim 82 wherein said settable material may be selectively set to said highly conducting state by means of radiant energy.

84. A subassembly as defined in claim 81 wherein one of said diodes may be fused so as to be highly conductive by means of radiant energy.

85. A subassembly as defined in claim 74 wherein said means for isolation include a thin film field effect transistor.

86. A subassembly as defined in claim 85 including first switching means series coupled with said thin film field effect transistor.

87. A subassembly as defined in claim 86 wherein said redundant means for isolation include a redundant thin film field effect transistor.

88. A subassembly as defined in claim 87 including second switching means series coupled with said redundant thin film field effect transistor.

89. A subassembly as defined in claim 88 wherein said first and second switching means are each selectively settable to a highly conducting state for electrically coupling said field effect transistor or said redundant field effect transistor to said pixel electrode.

90. A subassembly as defined in claim 74 wherein said means for isolation include first and second diodes series coupled.

91. A subassembly as defined in claim 74 wherein said means for isolation include a thin film fuse series coupled to a diode.

92. A method of making a subassembly for use in a display of a type incorporating a light influencing material, the method comprising:
providing a substrate;
forming a plurality of electrodes on said substrate in spaced apart relation;
forming at least one first isolation device coupled to a respective electrode of the plurality of electrodes; and
applying electrical potentials to each said isolation device individually to selectively test said isolation devices.

93. A method as defined in claim 92 including the further step of forming first and second sets of address lines with each said first isolation device being coupled between a respective different pair of address lines of said first and second sets of address lines.

94. A method as defined in claim 93 wherein said electrical potentials are applied between respective different pairs of address lines of said first and second sets of address lines.

95. A method as defined in claim 92 wherein the step of forming at least one isolation device includes forming one or more diodes.

96. A method as defined in claim 95 wherein said diodes are formed from semiconductor materials.

97. A method as defined in claim 96 including the step of depositing the semiconductor materials.

98. A method as defined in claim 97 wherein said deposited semiconductor materials are amorphous semiconductor alloys.

99. A method as defined in claim 96 wherein forming said diodes includes forming a first doped region, forming an intrinsic region overlying said first doped region, and forming a second doped region overlying said intrinsic region.

100. A method as defined in claim 99 wherein said first and second doped regions are formed opposite in conductivity.

101. A method as defined in claim 92 wherein said step of forming said isolation device includes forming one or more field effect transistors.

102. A method as defined in claim 101 wherein said field effect transistors are formed from semiconductor materials.

103. A method as defined in claim 102 including depositing the semiconductor materials.

104. A method as defined in claim 103 wherein said deposited semiconductor materials include amorphous semiconductor alloys.

105. A method as defined in claim 92 further including the step of forming at least one redundant isolation device associated with each said first isolation device with each of said redundant isolation devices being arranged to replace a given one of said first isolation devices.

106. A method as defined in claim 105 including the further step of replacing selected ones of said first isolation devices with their corresponding redundant isolation devices as a result of said testing of said first isolation devices.

107. A method as defined in claim 105 wherein said step of forming said first and redundant isolation devices includes forming diodes.

108. A method as defined in claim 106 further including the step of forming a switching device in series relation with each said redundant device.

109. A method as defined in claim 108 wherein said switching devices are normally substantially nonconductive and are settable to be comparatively highly conductive and wherein said replacing step includes setting each insulating device associated with said selected redundant devices.

110. A method as defined in claim 109 wherein said setting step includes short circuiting each switching device associated with each said selected redundant device.

111. A method as defined in claim 110 wherein said first, redundant, and switching devices are formed of semiconductor materials.

112. A method as defined in claim 111 including depositing the semiconductor materials on the substrate.

113. A method as defined in claim 112 wherein said deposited semiconductor materials are amorphous semiconductor alloys.

114. A method as defined in claim 110 wherein said step of short circuiting said switching devices includes electrically short circuiting said devices.

115. A method as defined in claim 110 wherein said step of short circuiting said switching devices includes short circuiting said devices with radiant energy.

116. A method as defined in claim 115 wherein said radiant energy is laser energy.

117. A method as defined in claim 106 wherein said replacing step includes uncoupling said selected first isolation devices from their associated electrodes.

118. A method as defined in claim 117 wherein said uncoupling step includes uncoupling said selected first isolation devices with radiant energy.

119. A method as defined in claim 118 wherein said radiant energy is laser energy.

120. A method as defined in claim 105 wherein said step of forming said first and redundant isolation devices includes forming thin film field effect transistors.

121. A method as defined in claim 108 wherein said step of forming said switching devices includes forming diodes.

122. A method as defined in claim 92 including forming at least one second isolation device coupled to the respective electrode of the plurality of electrodes and applying electrical potentials to each respective pair of said isolation devices to test said isolation devices.

123. A method as defined in claim 122 including the further step of forming first and second sets of address lines with each said pair of isolation devices being coupled between a respective different pair of address lines of said first and second sets of address lines prior to applying said electrical potentials.

124. A method as defined in claim 123 wherein said electrical potentials are applied between respective different pairs of address lines of said first and second sets of address lines.

125. A method as defined in claim 124 wherein said step of forming said isolation devices includes forming diodes.

126. A method as defined in claim 125 wherein said diodes are formed from semiconductor materials.

127. A method as defined in claim 126 wherein said semiconductor materials are deposited semiconductor materials.

128. A method as defined in claim 127 wherein said deposited semiconductor materials are amorphous semiconductor alloys.

129. A method as defined in claim 128 wherein said amorphous semiconductor alloys include silicon.

130. A method as defined in claim 128 wherein said amorphous semiconductor alloys include hydrogen.

131. A method as defined in claim 128 wherein said amorphous semiconductor alloys include fluorine.

132. A method as defined in claim 126 wherein said step of forming said diodes includes forming a first doped region, forming an intrinsic region overlying said first doped region, and forming a second doped region overlying said intrinsic region.

133. A method as defined in claim 132 wherein said first and second doped regions are opposite in conductivity.

134. A method as defined in claim 122 further including the step of forming a pair of redundant isolation devices associated with each said pair of isolation devices with each of said redundant isolation devices being arranged to replace a given member of said pair of isolation devices.

135. A method as defined in claim 134 including the further step of replacing selected ones of said isolation devices with their corresponding redundant isolation devices as a result of said testing of said isolation devices.

136. A method as defined in claim 135 wherein said replacing step includes uncoupling said selected first isolation diodes from their associated electrodes.

137. A method as defined in claim 136 wherein said uncoupling step includes uncoupling said selected first isolation devices with radiant energy.

138. A method as defined in claim 137 wherein said radiant energy is laser energy.

139. A method as defined in claim 135 wherein said step of forming said isolation and redundant isolation devices includes forming diodes.

140. A method as defined in claim 139 further including the step of forming a switching element in series relation with each said redundant diode.

141. A method as defined in claim 140 wherein said replacing step includes short circuiting each switching element associated with said selected redundant diode.

142. A method as defined in claim 141 wherein said step of short circuiting said switching elements includes electrically short circuiting said switching elements.

143. A method as defined in claim 141 wherein said step of short circuiting said switching elements includes short circuiting said switching elements with radiant energy.

144. A method as defined in claim 143 wherein said radiant energy is laser energy.

145. A method as defined in claim 141 wherein said first and redundant diodes, and said switching elements are formed from semiconductor materials.

146. A method as defined in claim 145 wherein said semiconductor materials are deposited semiconductor materials.

147. A method as defined in claim 146 wherein said deposited semiconductor materials are amorphous semiconductor alloys.

148. An assembly for use in making a display of the type having a plurality of pixels including a selected light influencing material, said assembly comprising:
a substrate;
a plurality of electrodes formed on said substrate;
a plurality of isolation devices formed on said substrate with each said isolation device coupled to a respective electrode of said plurality of electrodes; and
addressing means formed on said substrate for enabling the selective application of electrical potentials to each said isolation device for testing each said isolation device and also being arranged to enable selective addressing of said electrodes when the display is being normally operated.

149. An assembly as defined in claim 148 wherein each said isolation device, each said respective electrode and said addressing means are connected in series relation.

150. An assembly as defined in claim 149 including further a second plurality of electrodes with each electrode of said second plurality associated with and spaced apart from a respective electrode of said first plurality of electrodes.

151. An assembly as defined in claim 150 including a second substrate spaced apart from said substrate with said second plurality of electrodes formed thereon.

152. An assembly as defined in claim 151 wherein said respective first and second electrodes are pixel electrodes with light influencing material positionable therebetween.

153. An assembly as defined in claim 152 including second means for addressing coupled to said second plurality of pixel electrodes.

154. An assembly as defined in claim 150 wherein said second plurality of electrodes is formed on said substrate spaced apart from and substantially coplanar with said plurality of electrodes, said plurality of electrodes and said second plurality of electrodes forming respective pairs of electrode segments.

155. An assembly as defined in claim 154 including further a second substrate spaced apart from said substrate with a third plurality of electrodes formed thereon, each electrode of said third plurality being spaced apart from and associated with a respective pair of said electrode segments as a common electrode.

156. A display of a type incorporating a light influencing material comprising:
a plurality of pixels, each said pixel including at least a pair of spaced apart electrodes, light influencing material between said electrodes, and at least one first isolation device coupled to one of said electrodes; and
addressing means coupled to said first isolation devices and arranged to enable the selective application of electrical potentials to each of said isolation devices to test said isolation devices and arranged to enable the selective application of driving potentials across said electrode pairs for operating said display.

157. A display as defined in claim 156 with each said pixel further including a redundant isolation device corresponding to each respective first isolation device, each said redundant isolation device being arranged to be coupled between its associated electrode and said addressing means to replace its respective first isolation device.

158. A display as defined in claim 157 wherein at least some of said redundant isolation devices are disposed in replacement of their corresponding first isolation devices between their respective electrodes and said addressing means.

159. A display as defined in claim 157 wherein said first and redundant isolation devices comprise diodes.

160. A display as defined in claim 159 further including a switching device coupled in series relation with each said redundant diode.

161. A display as defined in claim 160 wherein each switching device is arranged to be short circuited for coupling its associated redundant diode between its respective electrode and said addressing means.

162. A display as defined in claim 161 wherein said first and redundant diodes and said switching devices are formed from semiconductor materials.

163. A display as defined in claim 162 wherein said semiconductor materials are deposited semiconductor materials.

164. A display as defined in claim 162 wherein said deposited semiconductor materials are amorphous semiconductor alloys.

165. A display as defined in claim 164 wherein said switching devices are arranged to be electrically short circuited.

166. A display as defined in claim 164 wherein said switching devices are arranged to be short circuited with radiant energy.

167. A display as defined in claim 166 wherein said radiant energy is laser energy.

168. A display as defined in claim 157 wherein said first isolation devices are arranged to be uncoupled with radiant energy from electrical connection between their associated electrodes and said addressing means.

169. A display as defined in claim 168 wherein said radiant energy is laser energy.

170. A display as defined in claim 157 wherein said first and redundant isolation devices comprise thin film field effect transistors.

171. A display as defined in claim 170 further including a switching device coupled in series relation with each said redundant thin film field effect transistor.

172. A display as defined in claim 171 wherein said switching devices are normally substantially nonconductive and are settable to be comparatively highly conductive for coupling said redundant isolating thin film field effect transistors between their associated electrodes and said addressing means.

173. A display as defined in claim 172 wherein said switchig devices are settable with radiant energy.

174. A display as defined in claim 190 wherein said radiant energy is laser energy.

175. A display as defined in claim 156 wherein said addressing means include first and second sets of address lines.

176. A display as defined in claim 175 wherein said isolation devices comprise diodes.

177. A display as defined in claim 176 wherein said diodes are formed from semiconductor materials.

178. A display as defined in claim 177 wherein said semiconductor materials are deposited semiconductor materials.

179. A display as defined in claim 178 wherein said deposited semiconductor materials are amorphous semiconductor alloys.

180. A display as defined in claim 179 wherein said amorphous semiconductor alloys include silicon.

181. A display as defined in claim 179 wherein said amorphous semiconductor alloys include hydrogen.

182. A display as defined in claim 179 wherein said amorphous semiconductor alloys include fluorine.

183. A display as defined in claim 177 wherein said diodes include a first doped region, an intrinsic region overlying said first doped region, and a second doped region overlying said intrinsic region.

184. A display as defined in claim 183 wherein said first and second doped regions are opposite in conductivity.

185. A display as defined in claim 156 wherein said first isolation devices comprise field effect transistors.

186. A display as defined in claim 185 wherein said field effect transistors are thin film field effect transistors including semiconductor materials.

187. A display as defined in claim 186 wherein said semiconductor materials are deposited semiconductor materials.

188. A display as defined in claim 187 wherein said deposited semiconductor materials are amorphous semiconductor alloys.

189. A display as defined in claim 188 wherein said amorphous semiconductor alloys include silicon.

190. A display as defined in claim 188 wherein said amorphous semiconductor alloys include hydrogen.

191. A display as defined in claim 188 wherein said amorphous semiconductor alloys include fluorine.

192. A display as defined in claim 156 wherein each said pixel includes, at least one second isolation device coupled to the other of said electrodes, and said addressing means coupled to said second isolation devices and arranged to enable the selective application of electrical potentials to each of said second isolation devices as to test said second isolation devices.

193. A display as defined in claim 192 wherein said addressing means include means for testing each said coupling between each said second isolation device and said respective other electrode.

194. A display as defined in claim 193 including a first substrate with said pairs of spaced apart electrodes formed thereon as electrode segments, the members of each said pair being coplanar and laterally spaced apart on said first substrate.

195. A display as defined in claim 194 including a second substrate in spaced apart relation to said first substrate and wherein each said pixel includes a third electrode formed on said second substrate as a common electrode overlying and spaced apart from said pair of electrode segments.

196. A display as defined in claim 195 with a selected liquid crystal material between said two substrates.

197. A display as defined in claim 196 wherein said liquid crystal material is a transmissive material.

198. A display as defined in claim 196 wherein said liquid crystal material is a reflective material.

199. A display as defined in claim 196 wherein said liquid crystal display material is a nematic liquid crystal display material.

200. A display as defined in claim 193 including first and second spaced apart substrates with said respective members of each said pair of electrodes formed thereon in spaced apart relationship as pixel electrodes with light influencing material positionable therebetween.

201. A display as defined in claim 156 wherein said addressing means includes means for testing each said coupling between each said first isolation device and said respective electrode.

202. A display as defined in claim 156 including at least one redundant isolation device series coupled with a switching element.

203. A display as defined in claim 202 wherein each said switching element includes:
first and second diodes series connected in reverse relation.

204. A display as defined in claim 203 wherein said diodes are formed from semiconductor materials.

205. A display as defined in claim 204 wherein said semiconductor materials are deposited semiconductor materials.

206. A display as defined in claim 205 wherein said deposited semiconductor materials are amorphous semiconductor alloys.

207. A display as defined in claim 206 wherein said amorphous semiconductor alloys include silicon.

208. A display as defined in claim 206 wherein said amorphous semiconductor alloys include hydrogen.

209. A display as defined in claim 206 wherein said amorphous semiconductor alloys include fluorine.

210. A display as defined in claim 203 wherein said diodes include a first doped region, an intrinsic region overlying said first doped region, and a second doped region overlying said intrinsic region.

211. A display as defined in claim 210 wherein said first and second doped regions are opposite in conductivity.

212. A display as defined in claim 203 wherein said switching element can be set from a relatively low conductivity state to a relatively high conductivity state by directing selected amounts of radiant energy at one of said diodes therein causing said diode to fuse and assume said high conductivity state.

213. A display as defined in claim 212 wherein said radiant energy is laser energy.

214. A display as defined in claim 202 wherein each said switching element includes:
a material settable from a substantially non-conducting state to a highly conducting state.

215. A display as defined in claim 214 wherein: said material is a chalcogenide.

216. A display as defined in claim 214 wherein said switching element can be set from a relatively low conductivity state to a relatively high conductivity state by directing selected amounts of radiant energy at said settable material causing said material to assume said highly conducting state.

217. A display as defined in claim 216 wherein said radiant energy is laser energy.

218. A display as defined in claim 202 wherein each said swtiching element includes:
at least a layer of a selected semiconductor material.

219. A display as defined in claim 218 wherein: said layer of semiconductor material is a deposited layer.

220. A display as defined in claim 219 wherein said deposited semiconductor material is an amorphous semiconductor alloy.

221. A display as defined in claim 220 wherein said amorphous semiconductor alloy includes silicon.

222. A display as defined in claim 220 wherein said amorphous semiconductor alloy includes hydrogen.

223. A display as defined in claim 220 wherein said amorphous semiconductor alloy includes fluorine.

224. A display as defined in claim 223 wherein said deposited layer of semiconductor material is a layer of a diode including a first doped region, an intrinsic region overlying said first doped region, and a second doped region overlying said intrinsic region.

225. A display as defined in claim 224 wherein said first and second doped regions are opposite in conductivity.

226. A display as defined in claim 224 wherein said switching element can be set from a relatively low conductivity state to a relatively high conductivity state by directing selected amounts of radiant energy at said diode causing said diode to fuse and assume said high conductivity state.

227. A display as defined in claim 226 wherein said radiant energy is laser energy.

228. A display as defined in claim 218 wherein said switching element can be set from a relatively low conductivity state to a relatively high conductivity state by directing selected amounts of radiant energy at said layer of selected semiconductor material causing said layer to fuse and to assume said high conductivity state.

229. A method of forming and testing a subassembly for a display including a light influencing material comprising the steps of:
providing a substrate;
forming a first electrode on the substrate;
forming a selected isolation device electrically coupled to the electrode;
forming a first address line on said substrate electrically coupled to the isolation device;
forming a second address line on said substrate electrically coupled to the electrode; and
applying selected electric potentials between the first and second address lines to test the electrical connectivity therebetween and the operation of the isolation device.

230. A method as defined in claim 229 including testing the electrical connectivity between the electrode and the isolation device.

231. A method as defined in claim 230 including further forming a redundant isolation device and replacing any tested and inoperative selected isolation device with the associated redundant isolation device.

232. A method as defined in claim 231 wherein replacing includes uncoupling any inoperative isolation device and coupling the redundant isolation device between the first address line and the electrode.

233. A method as defined in claim 232 wherein said uncoupling includes applying radiant energy to selectively remove a connection to the inoperative isolation device.

234. A method as defined in claim 233 wherein applying radiant energy includes selectively directing a laser beam at the connection to be removed.

235. A method as defined in claim 232 wherein forming the redundant isolation device includes forming a switching element series coupled to the redundant isolation device.

236. A method as defined in claim 235 wherein coupling the redundant isolation device includes providing electrical energy to convert the switching element from a low conductivity to a high conductivity state.

237. A method as defined in claim 235 wherein coupling the redundant isolation device includes providing radiant energy to convert the switching element from a low conductivity to a high conductivity state.

238. A method as defined in claim 237 wherein the radiant energy is laser energy.

239. A method as defined in claim 230 including: forming a redundant isolation device on the substrate.

240. A method as defined in claim 239 including: uncoupling the selected isolation device if inoperative; and
coupling the redundant isolation device between the first address line and the electrode.

241. A method as defined in claim 240 wherein the step of uncoupling includes directing radiant energy at the substrate to disconnect the inoperative device.

242. A method as defined in claim 241 wherein directing radiant energy includes directing a laser beam at a selected region of the substrate.

243. A method as defined in claim 241 wherein forming the redundant isolation device includes:
forming a selected switching element on the substrate in series with the redundant isolation device, the first address line, and the electrode to enable the redundant isolation device to be a potential replacement for the isolation device.

244. A method as defined in claim 243 including:
forming a second selected isolation device coupled between the first electrode and the second address line; and
forming a second redundant isolation device and second switching element on the substrate.

245. A method as defined in claim 244 including:
applying selected electric potentials between the first and second address lines;
determining if either of the selected isolation devices are inoperative;
uncoupling the selected isolation devices if inoperative; and
coupling the redundant isolation devices between the first and second address lines as replacements for the selected isolation devices.

246. A method as defined in claim 245 wherein coupling the redundant isolation devices includes;
setting the first and second switching elements to a highly conducting state thereby coupling the redundant isolation devices to the address lines as replacements for the isolation devices.

247. A method as defined in claim 246 wherein the step of setting includes:
directing radiant energy at the switching elements causing said elements to assume a high conductivity state in response thereto.

248. A subassembly for use in a display incorporating a light influencing material, the subassembly comprising:
a substrate;
a first electrode formed thereon; and
isolation means and redundant isolation means coupled to said electrode including means for selecting said redundant isolation means in the event of a failure of said isolation means.

249. A subassembly as defined in claim 248 wherein said isolation means and said redundant isolation means are parallel coupled.

250. A subassembly as defined in claim 249 wherein: said isolation means and said redundant means each include a diode.

251. A subassembly as defined in claim 250 wherein: said isolation means and said redundant isolation means each include a second diode coupled in series relation with said diode.

252. A subassembly as defined in claim 250 wherein: said isolation means and said redundant isolation means each include a thin film fuse coupled in series relation with said diode.

253. A subassembly as defined in claim 252 wherein: said thin film fuses are formed of a nickel-chromium alloy.

254. A subassembly as defined in claim 253 wherein said nickel-chromium alloy is deposited as a thin film.

255. A subassembly as defined in claim 250 including:
a second electrode formed on said substrate coplanar with said first electrode and spaced apart therefrom, said first and second electrodes formed as electrode segments.

256. A subassembly as defined in claim 255 including:
second isolation means and second redundant isolation means coupled to said second electrode segment.

257. A subassembly as defined in claim 256 wherein: said second isolation means and said second redundant isolation means each include a diode.

258. A subassembly as defined in claim 257 wherein: said second isolation means and said second redundant isolation means each include a second diode coupled in series relation with said diode.

259. A subassembly as defined in claim 257 wherein: said second isolation means and said second redundant isolation means each include a thin film fuse coupled in series relation with said diode.

260. A subassembly as defined in claim 250 including:
a switching element series coupled with said redundant means.

261. A subassembly as defined in claim 260 wherein said switching element includes:
semiconductor material settable from a substantially non-conducting state to a substantially highly conducting state.

262. A subassembly as defined in claim 261 wherein: said semiconductor material is a chalcogenide.

263. A subassembly as defined in claim 258 wherein said chalcogenide material is settable to a highly conducting state by radiant energy.

264. A subassembly as defined in claim 263 wherein said radiant energy is laser energy.

265. A subassembly as defined in claim 261 wherein said semiconductor material is deposited semiconductor material.

266. A subassembly as defined in claim 265 wherein said deposited semiconductor material is an amorphous semiconductor alloy.

267. A subassembly as defined in claim 265 wherein said alloy includes silicon.

268. A subassembly as defined in claim 265 wherein said alloy includes hydrogen.

269. A subassembly as defined in claim 265 wherein said alloy includes fluorine.

270. A subassembly as defined in claim 261 wherein:
said semiconductor material is formed with a first doped region, an intrinsic region overlying said first doped region and a second doped region overlying said intrinsic region.

271. A subassembly as defined in claim 270 wherein:
said semiconductor material includes first and second series coupled diodes.

272. A subassembly as defined in claim 270 wherein said semiconductor material is settable to a high conductivity state by radiant energy.

273. A subassembly as defined in claim 272 wherein said radiant energy is laser energy.

274. A subassembly as defined in claim 273 wherein said switching element is set to a high conductivity state by said laser energy heating and fusing said semiconductor material between first and second spaced apart conductors.

275. A method of forming a self-selecting redundant subassembly for use in a display comprising the steps of:
providing a substrate;
forming a electrode thereon; and
forming isolation means and redundant isolation means on the substrate including means for selecting the redundant isolation means in the event of a failure of the isolation means.

276. A method as defined in claim 275 wherein the steps of forming the isolation means and redundant isolation means include:
forming first and second parallel branches coupled to the electrode wherein each branch includes at least a first diode formed of semiconductor material.

277. A method as defined in claim 276 including:
forming in each parallel branch a second semiconductor diode, series coupled to the first diode.

278. A method as defined in claim 276 including:
forming in each branch a thin film fuse series coupled to the first diode.

279. A method as defined in claim 276 including:
applying operating potentials to each branch thereby selecting an operable branch; and
applying the operating potentials to the electrode through the selected branch.

* * * * *